United States Patent [19]
Inagaki et al.

[11] Patent Number: 5,648,964
[45] Date of Patent: Jul. 15, 1997

[54] MASTER-SLAVE MULTIPLEX COMMUNICATION SYSTEM AND PLL CIRCUIT APPLIED TO THE SYSTEM

[75] Inventors: Yoshio Inagaki, Tokyo; Masayuki Takami, Yamato; Masahiro Kataoka; Taro Shibagaki, both of Tokyo, all of Japan

[73] Assignee: Kabushiki Kaisha Toshiba, Kawasaki, Japan

[21] Appl. No.: 523,360

[22] Filed: Sep. 5, 1995

[30] Foreign Application Priority Data

| Sep. 9, 1994 | [JP] | Japan | 6-216157 |
| Nov. 2, 1994 | [JP] | Japan | 6-269710 |
| Jan. 31, 1995 | [JP] | Japan | 7-013739 |
| Jan. 31, 1995 | [JP] | Japan | 7-014555 |
| Jan. 31, 1995 | [JP] | Japan | 7-014642 |

[51] Int. Cl.$^6$ .................................................. H04L 7/08
[52] U.S. Cl. .................... 370/228; 370/517; 375/357; 375/376
[58] Field of Search ............................. 370/16, 100.1, 370/105.3, 112, 225, 228, 503, 516, 517, 375, 331, 327, 371; 375/347, 357, 376; 331/15, 17; 327/141, 144, 150, 292; 371/67.1, 68.2

[56] References Cited

U.S. PATENT DOCUMENTS

| 4,349,914 | 9/1982 | Evans | 375/347 |
| 4,633,193 | 12/1986 | Scordo | 375/357 |
| 4,651,103 | 3/1987 | Grimes | 375/357 |
| 4,849,993 | 7/1989 | Johnson et al. | 375/357 |
| 4,929,917 | 5/1990 | Yokogawa et al. | 375/376 |
| 5,059,925 | 10/1991 | Weisbloom | 375/357 |
| 5,157,696 | 10/1992 | Hara | 375/347 |
| 5,515,403 | 5/1996 | Sloan et al. | 375/357 |

FOREIGN PATENT DOCUMENTS 0 312 911  4/1989  European Pat. Off. .

*Primary Examiner*—Benedict V. Safourek
*Attorney, Agent, or Firm*—Oblon, Spivak, McClelland, Maier & Neustadt, P.C.

[57] ABSTRACT

A sharp phase variation of a clock is suppressed when master/slave status of a first and second communication device is changed over. The first and second communication devices respectively include clock selection circuits and clock production circuits for producing a synchronous clock from the selected clock, respectively, and supply the selected clock as the synchronous clock to the other communication device which is a mating-side device. One of the first and the second communication devices is a reference selection side and becomes a slave side, and the other device is a mating synchronous clock selection side and becomes a master side. Respective data signals from the communication devices are bit multiplexed in a multiplexing device on the basis of the synchronous clock. The first communication device includes a delay circuit for delaying the mating-side synchronous clock by a phase difference between a clock transmitted from the selection circuit through the clock production circuit and a clock transmitted in the mating-side device from the selection circuit through the selection circuit and the clock production circuit. In this manner, both clocks inputted into the selection circuits are made synchronous by the delay processing, so that a sharp phase variation at the master/slave changeover is suppressed and the multiplexed output from the multiplexing device remains virtually undisturbed during a master/slave change over event.

13 Claims, 14 Drawing Sheets

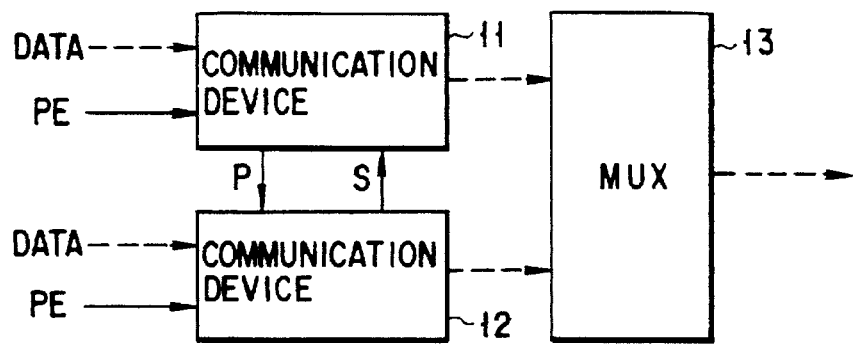
FIG. 1 (PRIOR ART)
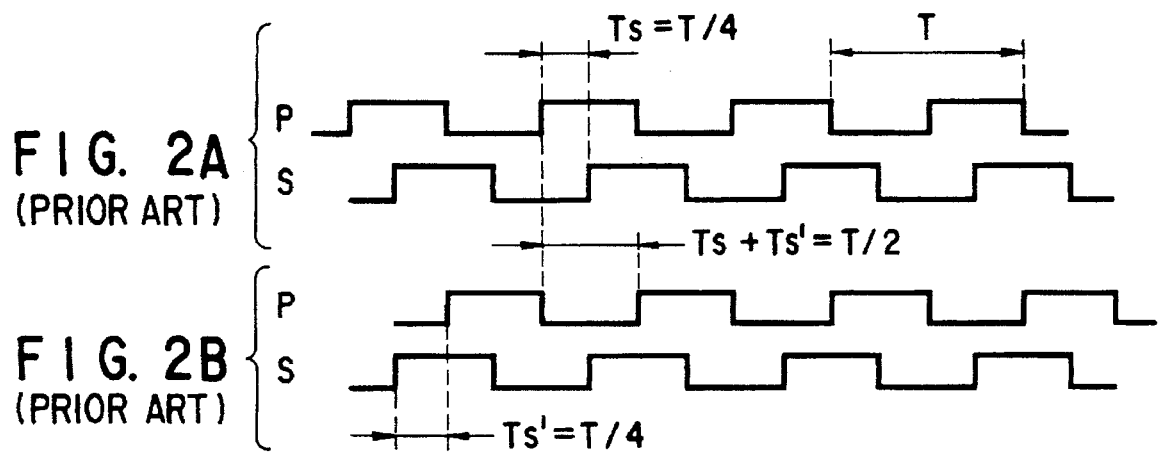
FIG. 2A (PRIOR ART)
FIG. 2B (PRIOR ART)
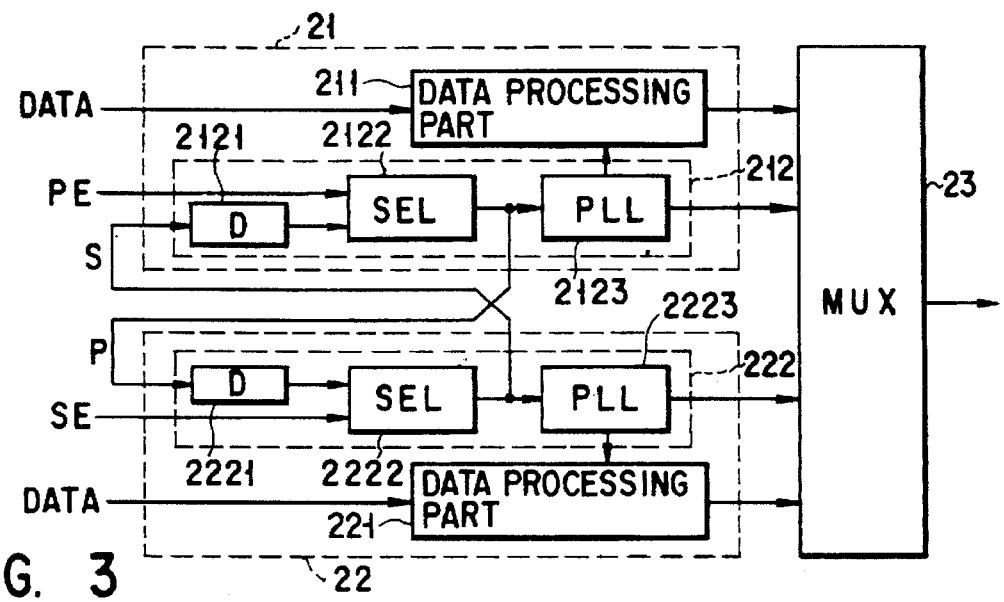
FIG. 3

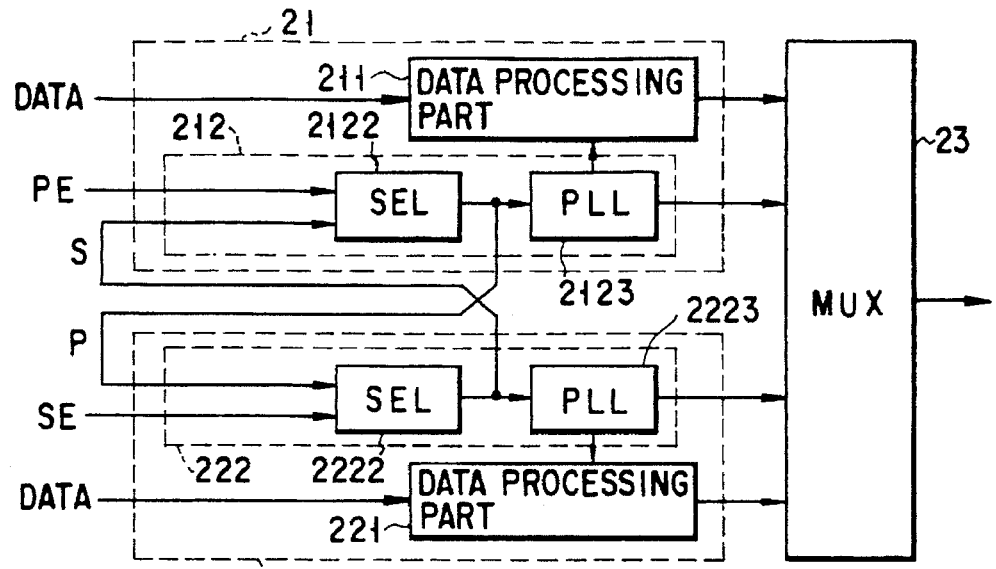
F I G. 4
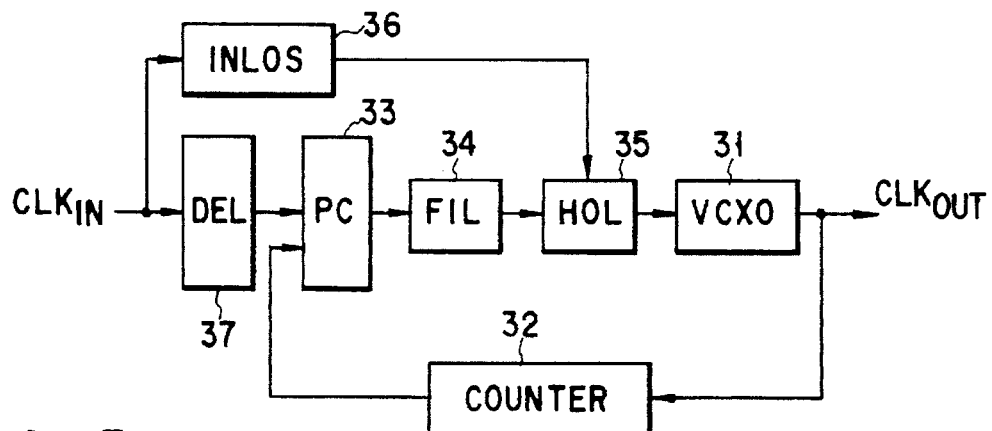
F I G. 5
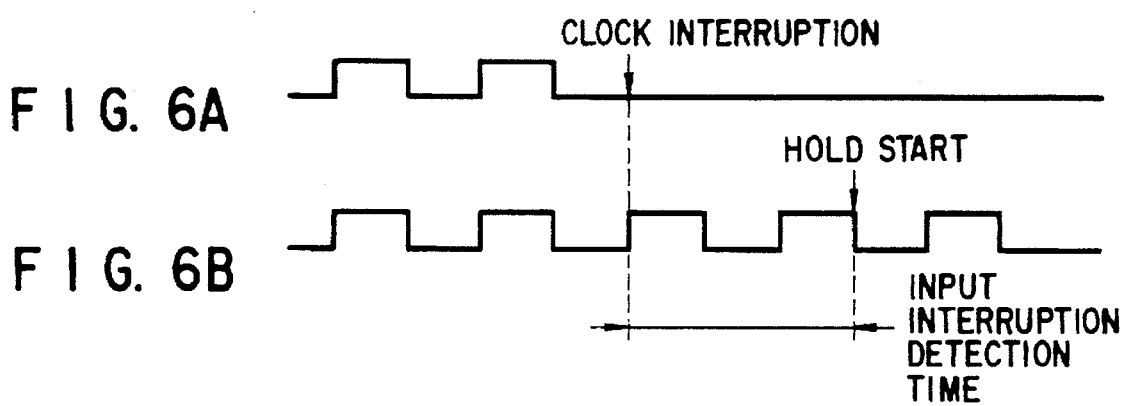
F I G. 6A
F I G. 6B

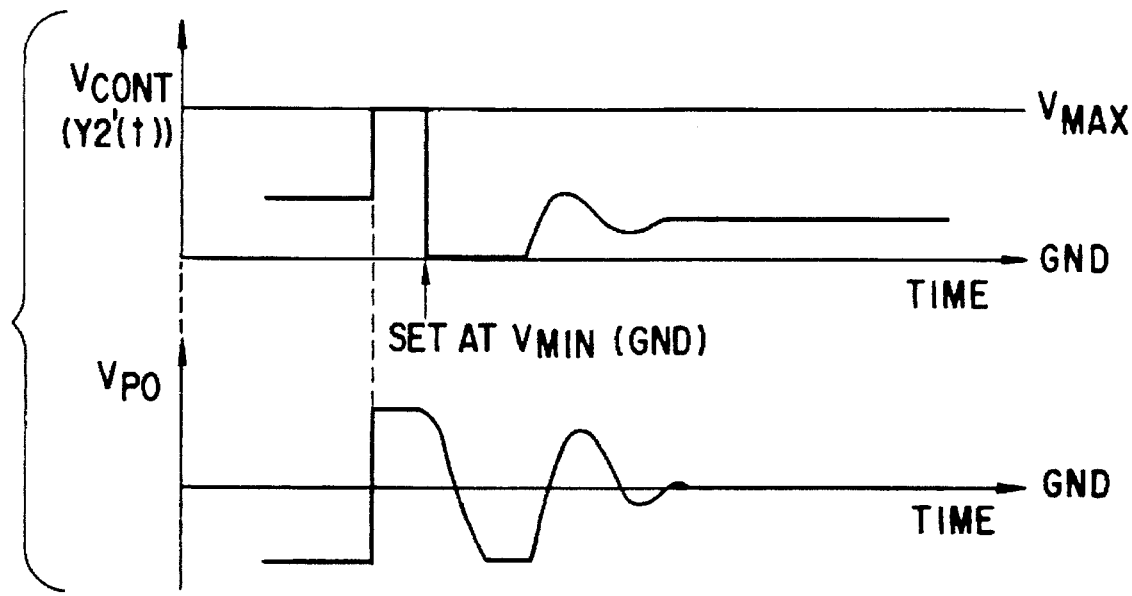
F I G. 11
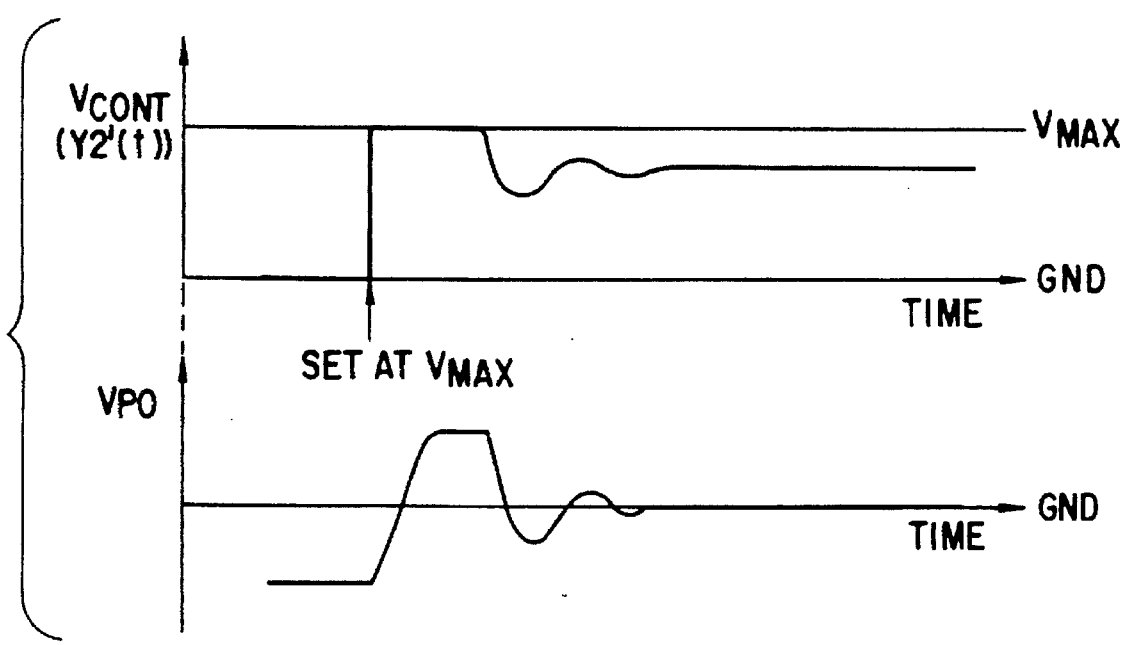
F I G. 12

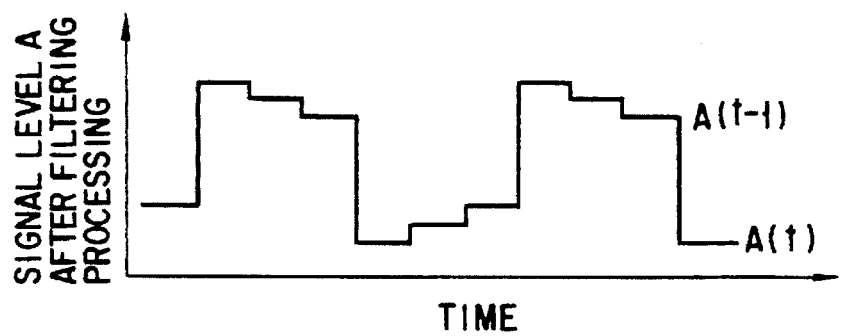
F I G. 16
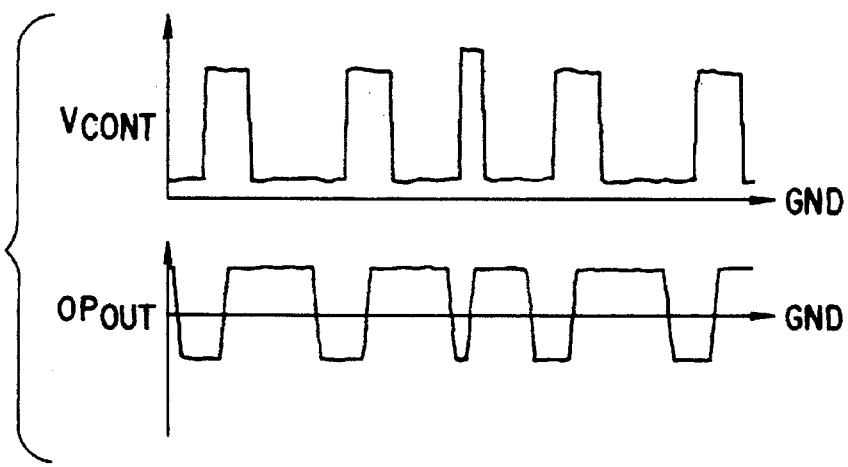
F I G. 17
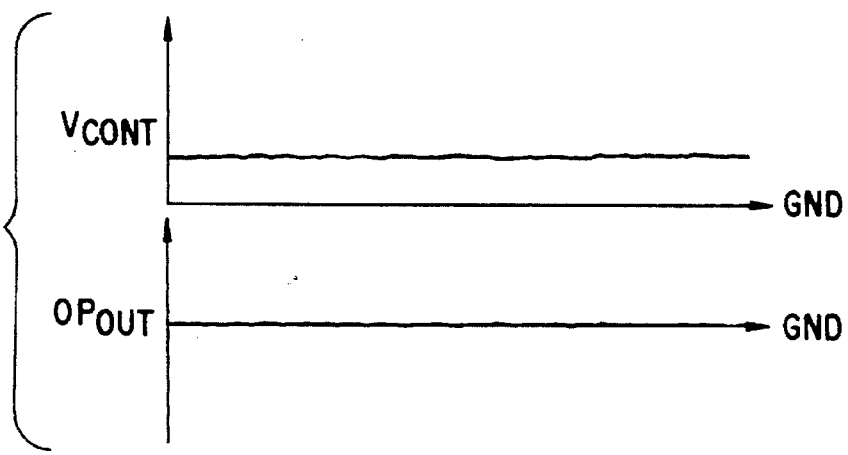
F I G. 18

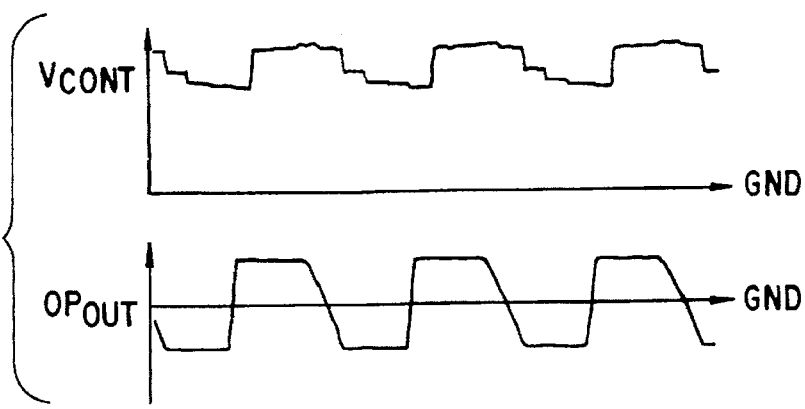
F I G. 19
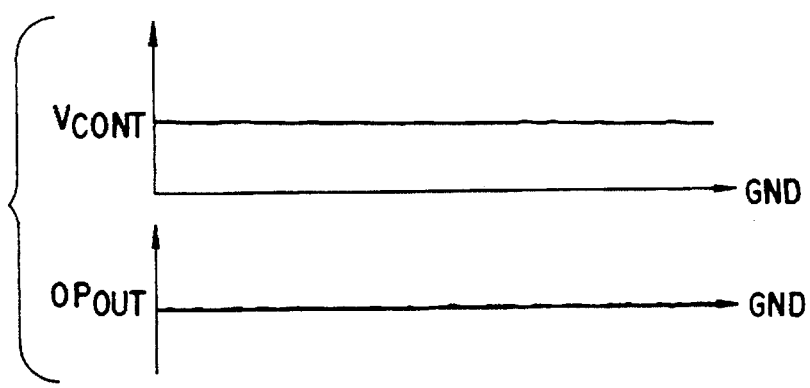
F I G. 20
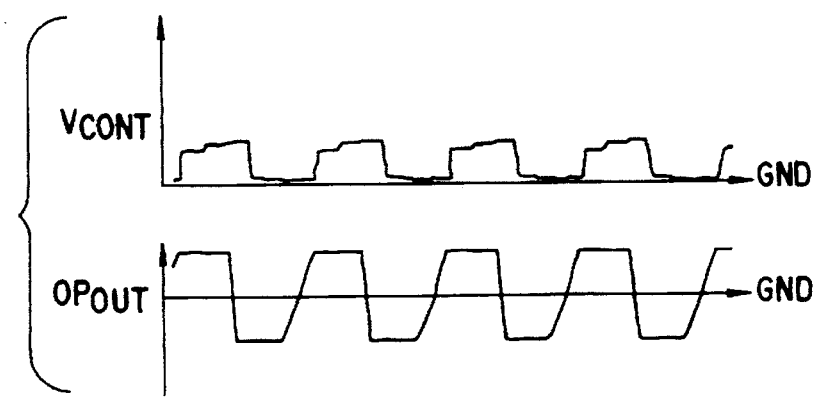
F I G. 21
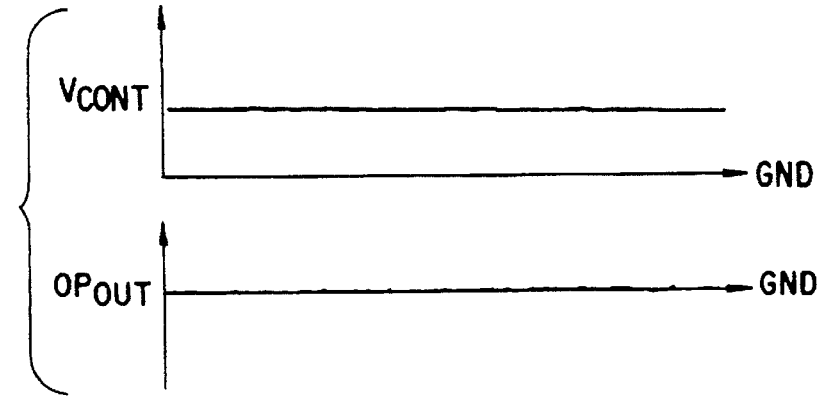
F I G. 22

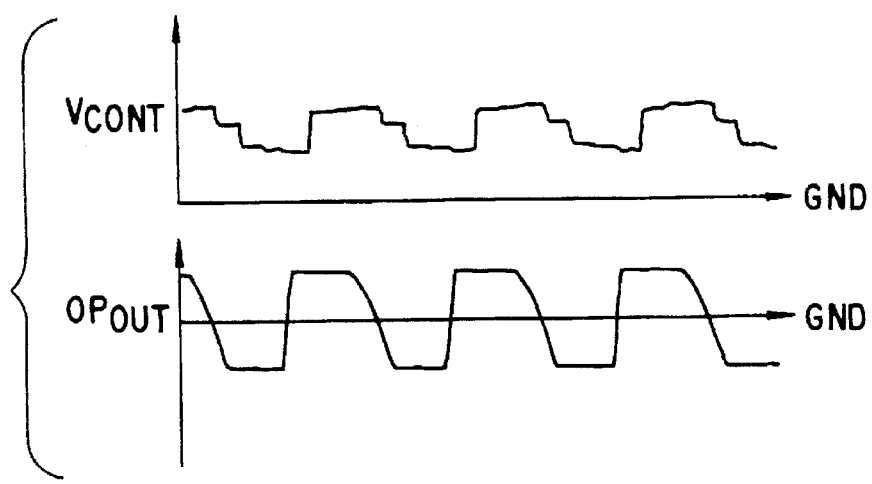
F I G. 23
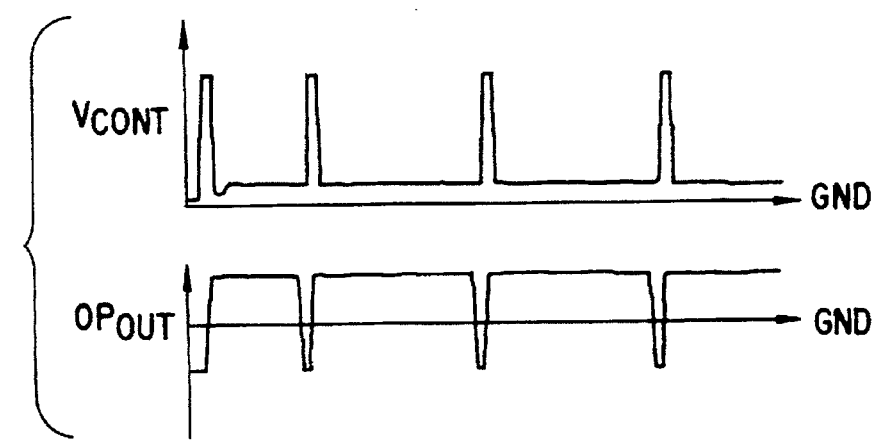
F I G. 24
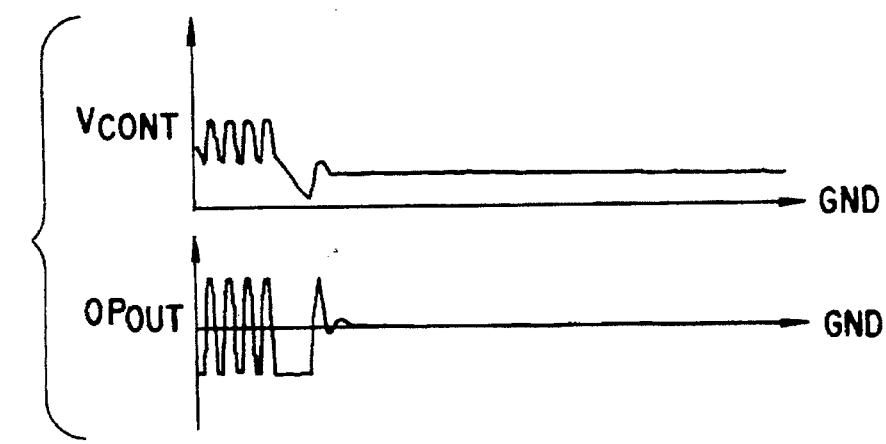
F I G. 25

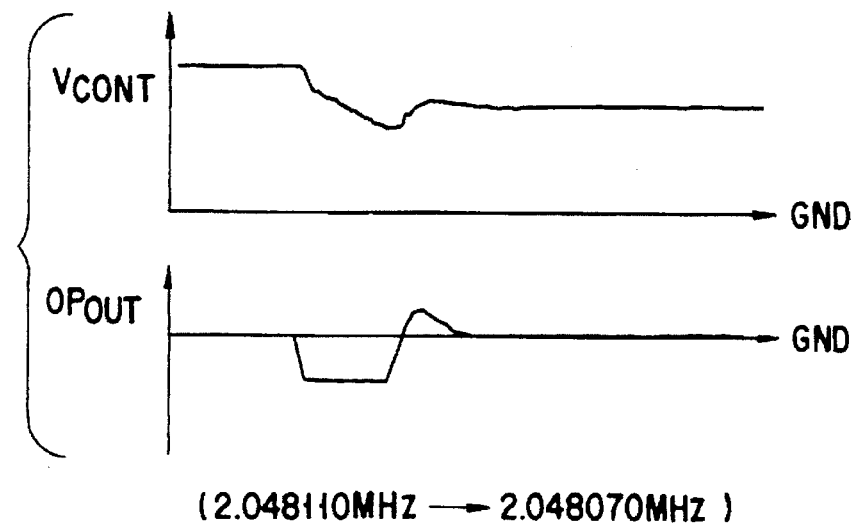
F I G. 26
( 2.048110MHz → 2.048070MHz )
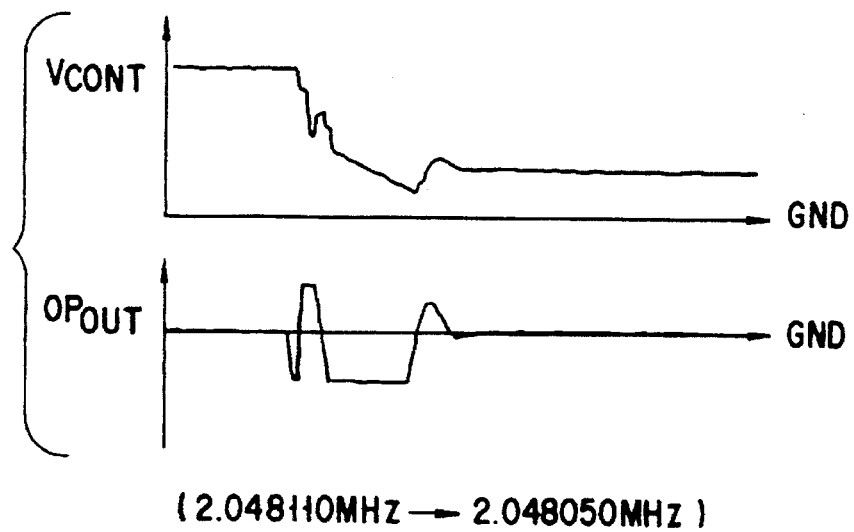
F I G. 27
( 2.048110MHz → 2.048050MHz )
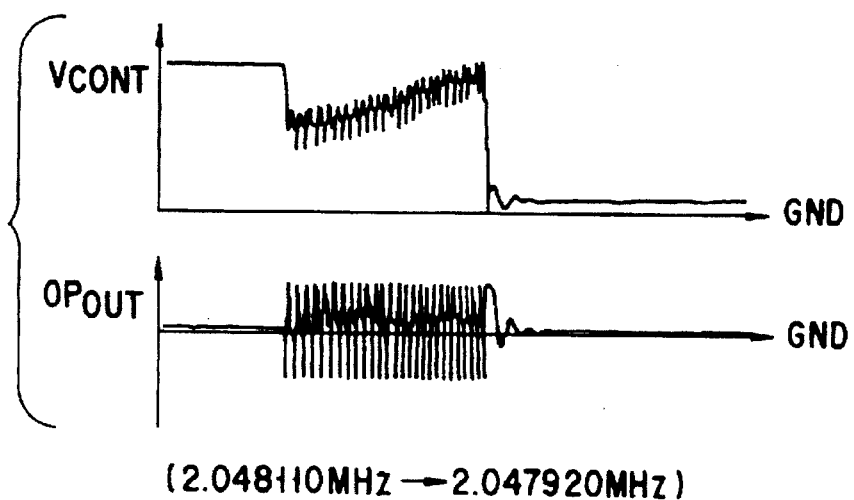
F I G. 28
( 2.048110MHz → 2.047920MHz )

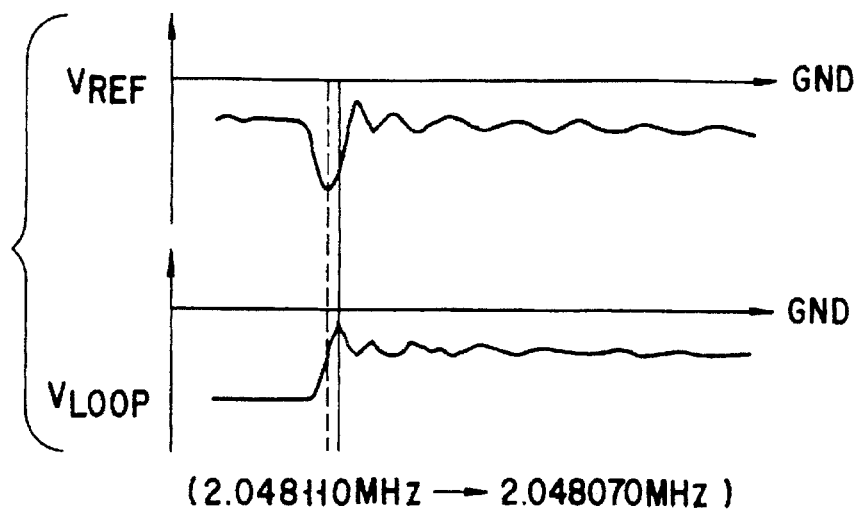
F I G. 29
(2.048110MHz → 2.048070MHz)
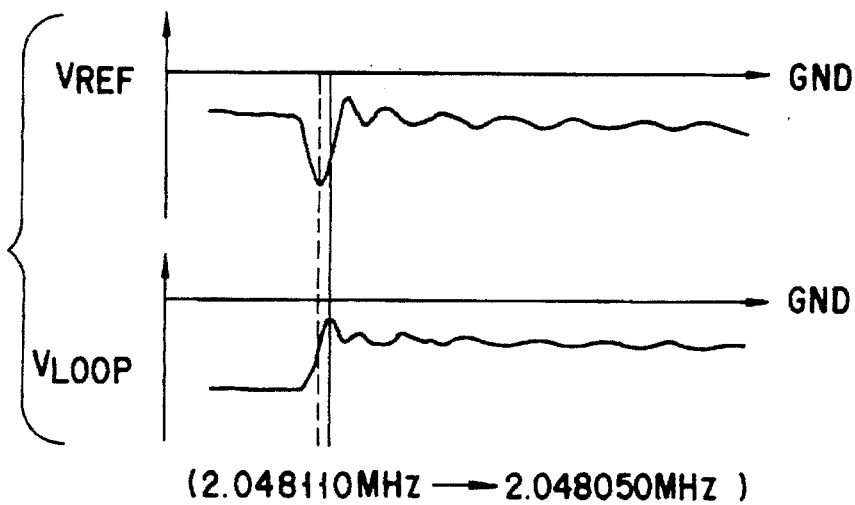
F I G. 30
(2.048110MHz → 2.048050MHz)
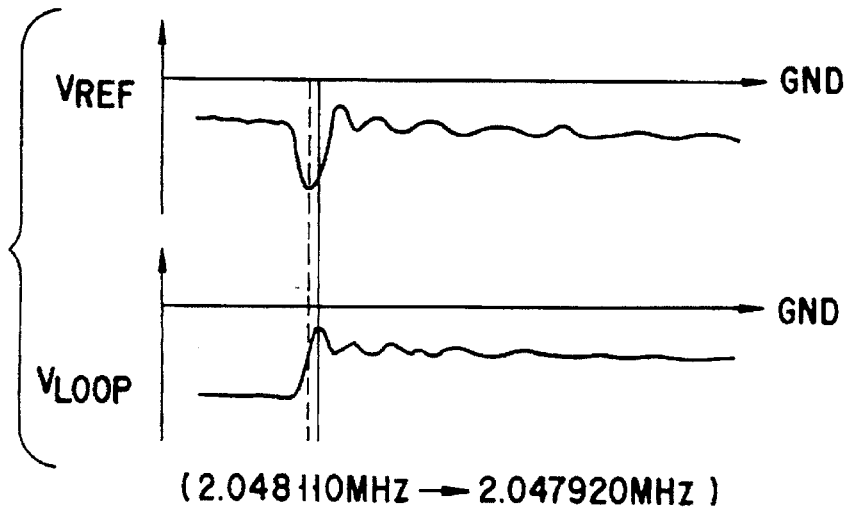
F I G. 31
(2.048110MHz → 2.047920MHz)

MASTER-SLAVE MULTIPLEX COMMUNICATION SYSTEM AND PLL CIRCUIT APPLIED TO THE SYSTEM

BACKGROUND OF THE INVENTION

1. Field of the Invention

The present invention relates to a master-slave multiplex communication system which allows a master communication device to synchronize with a slave communication device, bit multiplex the output of both the devices, and transmit the multiplexed output to another station at a high transmission rate, and particularly to the system having a function of changing over master and slave to each other.

2. Description of the Related Art

Also, the present invention relates to a PLL (phase synchronous loop) circuit utilized in the above-mentioned master-slave multiplex communication system, and particularly to the circuit capable of supplying a stable clock even if an interruption or sharp variation of an inputted clock occurs.

Heretofore, in some case, the output of two communication devices is bit multiplexed and communicated at a higher transmission rate. In this case, with one communication device set at master state, and the other communication device set at slave state, the clock on the slave side is allowed to synchronize with that on the master side, and the master and slave are changed over to each other as required. The configuration of such a conventional master-slave multiplex communication system is shown in FIG. 1. In FIG. 1, the broken line indicates a data signal, while the solid line indicates an input/output of a clock signal.

In FIG. 1, data signals outputted from a first, a second communication equipment 11, 12 are inputted into a multiplex processor (MUX) 13, in which the signals are bit multiplexed and outputted at a high transmission rate. With respect to clock signals, the first communication device 11 becomes a master state locked to a primary external reference clock (hereinafter called PE clock), and the second communication device 12 becomes a slave state locked to a P clock supplied from the first communication device 11, thereby keeping a synchronous state.

Now, if a trouble occurs in the PE clock, the second communication device 12 becomes a master state locked to a secondary external reference clock (hereinafter called PE clock), and the first communication device 11 becomes a slave state locked to an S clock supplied from the second communication device 12, thereby continuing to keep a synchronous state.

That is, the above-mentioned multiplex communication system can keep a synchronous relationship even when a clock trouble occurs by changing over the master and slave to each other between the first, the second communication devices 11, 12.

However, in the above-mentioned conventional multiplex communication system, when the master and slave are changed over, a sharp phase variation of clock occurs by the input of the MUX 13. The sharp phase variation causes a LOS (Loss of Frame) and an OOF (Out of Frame) in the MUX 13, which provides a problem. The state is shown in FIGS. 2A and 2B.

FIG. 2A shows a case where the first communication device 11 is in the master state, the second communication device 12 is in the slave state, and a phase difference Ts is 4/T. Also, FIG. 2B shows a case where the first communication device 11 is in the slave state, the second communication device 12 is in the master state, and a phase difference Ts' is 4/T. In this case, where the first communication device 11 is changed over from the master to slave, the first communication device 11 is delayed by the phase difference Ts' behind the second communication device 12 and locked, so that a phase variation of T/2 occurs.

As described above, in the conventional multiplex communication system, there has been a problem that when the master and the slave are changed over to each other, the multiplex processing inputs cause a sharp clock phase variation, thereby leading to a trouble of LOS and OOF in a multiplex processing part.

Now, in the above-mentioned multiplex communication system, respective master and slave communication devices have the PLL circuits, by which an internal clock in synchronism with an input clock is generated.

The PLL circuit used here is required to continue to generate a stable clock even if the input clock is interrupted or a sharp variation occurs due to the changeover of the master and the slave. For this reason, heretofore, the PLL circuit having a holdover function is widely used.

However, the configuration of the holdover function in the conventional PLL circuit has problems that fundamentally the accuracy is poor, and depending on the timing at which the clock is interrupted, the frequency of the output clock changes before and after the clock interruption is generated, and that it is easily affected by power voltage variation and temperature change. Also, depending on the device, there is a case where the holdover function cannot be loaded on the PLL circuit.

Although some PLL circuit uses a digital processing technique, in a conventional digital PLL circuit, because of the arithmetic processing delay of a digital filter, a change in control voltage may not follow a change in phase comparison output, whereby the synchronous pull-in may become difficult. That is, a sufficient capture range has not been obtained.

Also, although a problem does not exist relatively where the oscillating frequency of a voltage control oscillator is relatively low and the allowable range of a control voltage can be made relatively wide, a highly accurate synchronous pull-in processing becomes necessary where a oscillator having a high oscillating frequency and a narrow allowable range of a control voltage is used.

Also, in the PLL circuit, generally a reference clock signal employs a redundant configuration to obtain reliability. In this case, the transient response characteristics of a loop must be delayed to pull in a lock at the changeover of the signal. However, when the characteristics of a loop filter is made delayed, the response thereof in a steady-state operation also becomes delayed.

SUMMARY OF THE INVENTION

A first object of the present invention is to provide a master-slave multiplex communication system which can suppress a sharp clock phase variation generated by a multiplex processing input at the master/slave changeover, and can eliminate a probability of causing a problem of LOS and OOF in the multiplex processing part.

Further, a second object of the present invention is to provide a PLL circuit which can continue to output a clock signal with the same frequency as that before interruption even if a clock signal as a reference is interrupted, and provide a PLL circuit which is suitable for use in the above-mentioned master-slave multiplex communication system, and in which the frequency of an output clock signal is not changed even if a power voltage variation or a temperature variation occurs.

Further, a third object of the present invention is to provide a digital PLL circuit which can obtain a sufficient capture range even if a digital filter has an arithmetic processing delay, thereby allowing a large phase change to be followed positively.

Further, a fourth object of the present invention is to provide a digital PLL circuit which can execute a highly accurate synchronous pull-in processing even where a voltage control oscillator having a relatively high oscillating frequency and a narrow allowable range of a control voltage is used.

Further, a fifth object of the present invention is to provide a redundant-configuration PLL circuit which with a simple configuration, makes delayed the transient response characteristics of an output phase variation occurring when a reference clock signal is changed over, and can respond to a steady-state variation and a micro-variation at a high rate.

The master-slave multiplex communication system of the first invention for achieving the first object is comprised as set fourth in claim 1.

The PLL circuit of the second invention for achieving the second object is comprised as set fourth in claim 3.

The digital PLL circuit of the third invention for achieving the third object is comprised as set fourth in claim 7.

The digital PLL circuit of the fourth invention for achieving the fourth object is comprised as set fourth in claim 9.

The PLL circuit of the fifth invention for achieving the fifth object is comprised as set fourth in claim 11.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block circuit diagram showing a configuration of a conventional master-slave multiplex communication system.

FIGS. 2A and 2B are timing waveform charts showing a state of a sharp phase variation occurring when master/slave of a clock signal is changed over in a conventional system.

FIG. 3 is a block circuit diagram showing a configuration of a first embodiment of a master-slave multiplex communication system in connection with the first invention.

FIG. 4 is a block circuit diagram showing a configuration of a second embodiment of a master-slave multiplex communication system in connection with the first invention.

FIG. 5 is a block circuit diagram showing a configuration of a first embodiment of a PLL circuit having a holdover function in connection with the second invention.

FIGS. 6A and 6B are timing waveform charts to help explain the operation of the holdover function of the embodiment.

FIG. 11 is a waveform chart showing a signal waveform used to explain the operation of the digital filter shown in FIG. 10.

FIG. 12 is a waveform chart showing a signal waveform used to explain the operation of the digital filter shown in FIG. 10.

FIG. 16 is a waveform chart showing one example of the signal waveform after filtering processing obtained in the digital filter of the digital PLL circuit shown in FIG. 13.

FIG. 17 is a waveform chart showing one example of the waveform of a control signal voltage and a phase comparison signal where the synchronous pull-in of the digital PLL circuit shown in FIG. 13 cannot be executed.

FIG. 18 is a waveform chart showing the waveform of a control signal voltage and a phase comparison signal after power on reset is executed for the waveform shown in FIG. 17.

FIG. 19 is a waveform chart showing another example of the waveform of a control signal voltage and a phase comparison signal where the synchronous pull-in of the digital PLL circuit shown in FIG. 13 cannot be executed.

FIG. 20 is a waveform chart showing the waveform of a control signal voltage and a phase comparison signal after power on reset is executed for the waveform shown in FIG. 19.

FIG. 21 is a waveform chart showing still another example of the waveform of a control signal voltage and a phase comparison signal where the synchronous pull-in of the digital PLL circuit shown in FIG. 13 cannot be executed.

FIG. 22 is a waveform chart showing the waveform of a control signal voltage and a phase comparison signal after power on reset is executed for the waveform shown in FIG. 21.

FIG. 23 is a waveform chart showing yet another example of the waveform of a control signal voltage and a phase comparison signal where the synchronous pull-in of the digital PLL circuit shown in FIG. 13 cannot be executed.

FIG. 24 is a waveform chart showing the waveform of a control signal voltage and a phase comparison signal after power on reset is executed for the waveform shown in FIG. 23.

FIG. 25 is a waveform chart showing the waveform of a control signal voltage and a phase comparison signal after the frequency of a reference clock signal VREF is made changed for the waveform shown in FIG. 23.

FIG. 26 is a waveform chart showing one example of the waveform of a control signal voltage and a phase comparison signal representing an effect of the digital PLL circuit shown in FIG. 13.

FIG. 27 is a waveform chart showing another example of the waveform of a control signal voltage and a phase comparison signal representing an effect of the digital PLL circuit shown in FIG. 13.

FIG. 28 is a waveform chart showing still another example of the waveform of a control signal voltage and a phase comparison signal representing an effect of the digital PLL circuit shown in FIG. 13.

FIG. 29 is a waveform chart showing one example of the waveform of a reference clock signal and a feedback clock signal representing an effect of the digital PLL circuit shown in FIG. 13.

FIG. 30 is a waveform chart showing another example of the waveform of a reference clock signal and a feedback clock signal representing an effect of the digital PLL circuit shown in FIG. 13.

FIG. 31 is a waveform chart showing still another example of the waveform of a reference clock signal and a feedback clock signal representing an effect of the digital PLL circuit shown in FIG. 13.

DETAILED DESCRIPTION OF THE PREFERRED EMBODIMENTS

Figure 7:
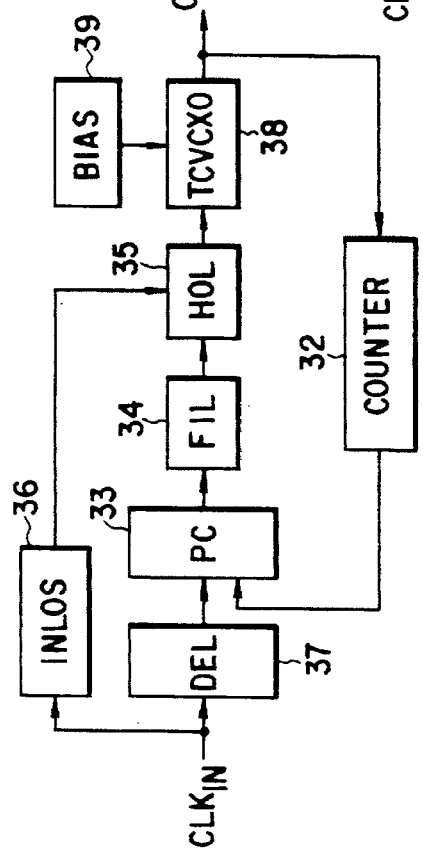
FIG. 7 is a block circuit diagram showing a configuration of a second embodiment of a PLL circuit having a holdover function in connection with the second invention.

With reference to the drawings, respective embodiments of the first through fifth inventions will be explained in detail hereinafter.

FIG. 3 shows a configuration of a first embodiment of a master-slave multiplex communication system in connection with the first invention, in which reference code 21 designates a first communication device; 22, a second communication device; and 23, an MUX. Inputted into the first communication device 21 are a data signal S1 together with a PE clock in synchronism with the signal and an S clock from the second communication device 22; and inputted into the second communication device 22 are a data signal $2 together with an SE clock in synchronism with the signal and a P clock from the first communication device 21.

The first communication device 21 includes a data processing part 211 and a clock processing part 212. The clock processing part 212 is configured by a delay circuit (D) 2121 for delaying the S clock by a predetermined time, a selection circuit (SEL) 2122 for selecting either of the PE clock and the delayed S clock, and a clock production circuit (PLL) 2123 for locking to the clock selected in the selection circuit 2122 and producing a synchronous clock of a frequency required for the data processing part 211. The data processing part 211 timing controls an input data on the basis of the synchronous clock produced in the clock production circuit 2123 to output the input data.

The second communication device 22 also has the similar configuration to the first communication device 21, and includes a data processing part 221 and a clock processing part 222. The clock processing part 222 is configured by a delay circuit (D) 2221 for delaying the P clock by a predetermined time, a selection circuit (SEL) 2222 for selecting either of the SE clock and the delayed P clock, and a clock production circuit (PLL) 2223 for locking to the clock selected in the selection circuit 2222 and producing a synchronous clock of a frequency required for the data processing part 221. The data processing part 221 timing controls an input data on the basis of the synchronous clock produced in the clock production circuit 2223 to output the input data.

Data signals outputted from the first, the second communication devices 21, 22 are fed together with the synchronous clocks produced in the respective clock production circuits 2123, 2223 to the MUX 23, in which the data signals are multiplexed and transmittedly outputted.

That is, in the system having the above-mentioned configuration, the delay circuits 2121, 2221 are provided for adjusting the phase of the P clock and the S clock outputted from the first, the second communication devices 21, 22, whereby the phase of clocks inputted into the selection circuits 2122, 2222 is adjusted, so that a sharp phase variation occurring when master/slave is changed over is suppressed. The processing operation will be explained in detail hereinafter.

Assume that first, the selection circuit 2122 of the first communication device 21 selects the PE clock, and the selection circuit 2222 of the second communication device 22 selects the P clock from the first communication device 21. Thus, the first communication device 21 is in the master state, and the second communication device 22 is in the salave state. In FIG. 3, the delay time in each circuit block and transmission line is expressed as T1, T2 for the delay circuits 2121, 2221, as TS1, TS2 for the selection circuits 2122, 2222, as TP1, TP2 for the clock production circuits 2123, 2223, and as TM1, TM2 for the line to the MUX 23.

The phase difference of the synchronous clock from the first, the second communication devices 21, 22 inputted into the MUX 23 is a difference between the delay time from the selection circuit 2122 through the clock production circuit 2123 to the MUX 23 and the delay time from the selection circuit 2122 through the second communication device 22 as the P clock to the MUX 23. Thus, the phase difference Ts is expressed in the following equation:

$$Ts=(TP1+TM1)-(TP+T2+TS2+TP2+TM2) \tag{1}$$

Similarly, the phase difference Ts' of the synchronous clock inputted into the MUX 23 where the second communication device 22 is in the master state, and the first communication device 21 is in the slave state is expressed in the following equation:

$$Ts'=(TP2+TM2)-(TS+T1+TS1+TP1+TM1) \tag{2}$$

The phase difference at master/slave changeover becomes the sum of Ts and Ts', so that the following equation is obtained:

$$\begin{aligned}
\text{Ts} + \text{Ts}' &= (TP1 + TM1) - \\
&\quad (TP + T2 + TS2 + TP2 + TM2) + \\
&\quad (TP2 + TM2) - \\
&\quad (TS + T1 + TS1 + TP1 + TM1) \\
&= (TP + T2 + TS2 + TS + T1 + TS1)
\end{aligned} \quad (3)$$

Now assuming that n=1, 2, 3, ..., and signal frequency is taken as T, and adjusting the delay times T1, T2 of the delay circuits 2121, 2221 so that the following equation is established:

$$(TP+T2+TS2+TS+T1+TS1)=nT \quad (4)$$

the equation (3) becomes as follows:

$$TS+Ts'=-nT=0 \quad (5)$$

Accordingly, the phase variation can be suppressed.

Then, the phase adjusting method will be described.

When the first communication device 21 selects the PE clock, and the second communication device 22 selects the P clock from the first communication device 21, and thus the first communication device 21 is in the master state, and the second communication device 22 is in the slave state, a phase difference dS between two clocks inputted into the selection circuit 2122 is expressed in the following equation:

$$dS=TS1+TP+T2+TS2+TS2+TS \quad (6)$$

which becomes equal to the equation (4). Therefore, using the delay circuits 2121, 2221, the input of the selection circuit 2122 of the first communication device 21 is phase adjusted, so that a sharp phase variation occurring when master/slave is changed over is suppressed.

FIG. 4 shows a configuration of a second embodiment of a master-slave multiplex communication system in connection with the first invention. In FIG. 4, the same parts as those of FIG. 3 are designated by the same reference codes, and thus only different parts will be explained here.

That is, in the configuration of this embodiment, the above-mentioned delay circuits 2121, 2221 are omitted, and as shown in FIG. 4, respective processing delay time of the selection circuits 2122, 2222 is set at nT, and the delay time of each transmission line of the PE clock and the SE clock is previously set at nT. Thus, the following equation is obtained:

$$\begin{aligned}
\text{Ts} + \text{Ts}' &= -(TP + TS2 + TS + TS1) \\
&= -(nT + nT + nT + nT) \\
&= -4nT \\
&= 0
\end{aligned} \quad (7)$$

so that it will be understood that the phase variation can be suppressed.

However, in the above-mentioned configuration, though the time and labor to perform the phase adjustment can be omitted compared to the configuration of FIG. 3, it becomes necessary to manage the delay time of the SE clock, the clock production circuit 2123, the selection circuit 2222, and the clock transmission line.

As described above, either of embodiments can suppress a sharp phase variation of the clocks by the multiplex processing inputs occurring when master/slave is changed over, and eliminate a probability of causing a problem of LOS and OOF in the multiplex processing part.

Now, effective as the PLL circuit used in the above-mentioned master-slave multiplex communication system is the one having a holdover function for keeping an output state before interruption occurrence even if the reference clock sign becomes interrupted. However, the PLL circuit having a conventional holdover function, if a clock signal as a reference is interrupted, will output a clock signal with a frequency different from that before the interruption. There is also a problem that a power voltage variation or a temperature variation causes the frequency of the output signal of the voltage control oscillator to be changed. Thus, there are provided a PLL circuit which can continue to output a clock signal with the same frequency as that before interruption even if a clock signal as a reference is interrupted, and a PLL circuit in which the frequency of an output clock signal is not changed even if a power voltage variation or a temperature variation occurs.

FIG. 5 shows a configuration of a first embodiment of a PLL circuit having a holdover function in connection with the second invention.

In FIG. 5, in a voltage control crystal oscillator (VCXO) 31 for generating a clock signal CLKout, the central frequency is set at a value N times a reference clock signal CLKin, and the oscillation output is supplied to a counter 32. The counter 32 counts the output clock signal of VCXO 31 to the same frequency as the reference clock signal CLKin to divide the frequency into 1/N, so that the frequency divided clock signal is supplied to a phase comparator (PC) 33. The phase comparator 33 is supplied through a delay circuit (DEL) 37 with the reference clock signal CLKin.

The phase comparator 33 produces a signal (hereinafter called a phase difference detection signal) correspondent to a phase difference between two input clock signals, so that the phase difference detection signal is supplied to a low-pass filter (FIL) 34.

The low-pass filter 34 removes a high-pass component from the phase difference detection signal to convert it a direct-current voltage signal, so that the direct-current voltage signal is supplied through a holdover circuit (HOL) 35 to the VCXO 31 as a voltage control signal.

Thus, there is applied a control loop in accordance with the phase difference between two clock signals inputted into the phase comparator 33, so that the phase of the two clock signals inputted into the phase comparator 33 is locked, and a clock signal having a frequency N times the reference clock signal CLKin is outputted from the VCXO 31.

At this point, the reference clock signal CLKin is also supplied to an input interruption detector (INLOS) 36. The input interruption detector 36 monitors the reference clock signal CLKin and outputs an input interruption detection signal when detecting an input interruption, the detection signal being supplied to the holdover circuit 35.

The holdover circuit 35 outputs the direct-current voltage signal from the filter 34, in that state, as a voltage control signal to the VCX0 31 where the reference clock signal CLKin is normal, and when the input interruption detection signal is supplied from the input interruption detector 36, at the timing, holds the direct-current voltage signal from the filter 34 to continue to output the voltage held in the VCXO 31.

In the above-mentioned configuration, the operation will be explained hereinafter. The PLL circuit is characterized in that the reference clock signal CLKin is inputted through the delay circuit 37 into the phase comparator 33.

That is, if the delay circuit 37 is not provided, when the reference clock signal CLKin is interrupted, the phased difference could not be detected by the phase comparator 33, whereby the direct-current voltage signal outputted from the low-pass filter 34 will fluctuate, and the oscillation frequency of the VCXO 31 will be changed.

On the other hand, the input interruption detector 36 requires a time corresponding to several clocks before detecting an interruption state of the reference clock signal CLKin. Therefore, at the point when an input interruption is detected, the output of the low-pass filter 34 is already shifted from the level at the point before the clock input interruption occurs. For this reason, even if the holdover circuit 35 is allowed to hold the output voltage of the low-pass filter 34 at the timing of the input interruption detection signal, the oscillation frequency of the VCXO 31 could not be kept at the frequency at a time before the clock input interruption occurs.

Thus, in the PLL circuit of this embodiment, the reference clock signal CLKin is allowed to be delayed sufficiently by the delay circuit 37 so as to be inputted into the phase comparator 33. The waveform of the reference clock signal CLKin at this point is shown in FIG. A; and the output waveform of the delay circuit 37 is shown in FIG. 6B.

As seen from FIGS. 6A and 6B, if the reference clock signal CLKin is delayed by several clocks by the delay circuit 37, even when the reference clock signal CLKin becomes an interruption state, the input clock signal CLKin of the phase comparator 33 is not interrupted immediately. Thus, the phase difference detection signal is continuously inputted into the low-pass filter 34, so that the voltage signal before clock interruption occurs is inputted into the holdover circuit 35.

Now, if the delay time of the delay circuit 37 is made longer than the time required for input interruption detection, at the timing of the input interruption detection signal generation, the same signal as that before the reference clock signal CLKin is interrupted is inputted into the holdover circuit 35. Thus, the holdover circuit 35 holds the same value as that before interruption occurs, and the VCXO 31 continues to output a clock signal with the same frequency as the signal before interruption occurs.

FIG. 7 shows a second embodiment of a PLL circuit in connection with the second invention. In the PLL circuit in this embodiment, different points from the configuration of the first embodiment shown in FIG. 5 are that a voltage control crystal oscillator (TCVCXO) 38 having a temperature compensation function is used as a VCXO, and that a bias stabilization circuit (BIAS) 39 for supplying a stable voltage to the oscillator 38 is additionally provided.

That is, in the PLL circuit of the first embodiment, a problem occurs that after holdover, the frequency of the VCXO 31 is changed by a power voltage variation and a temperature variation. Thus, instead of the VCXO, the TCVCXO 38 is used, whereby the oscillator frequency is stabilized with respect to the temperature variation. Further, the bias stabilization circuit 39 is used to supply a stable bias to the TCVCXO 38, so that the oscillator frequency is not changed also with respect to the power voltage variation.

Figure 8:
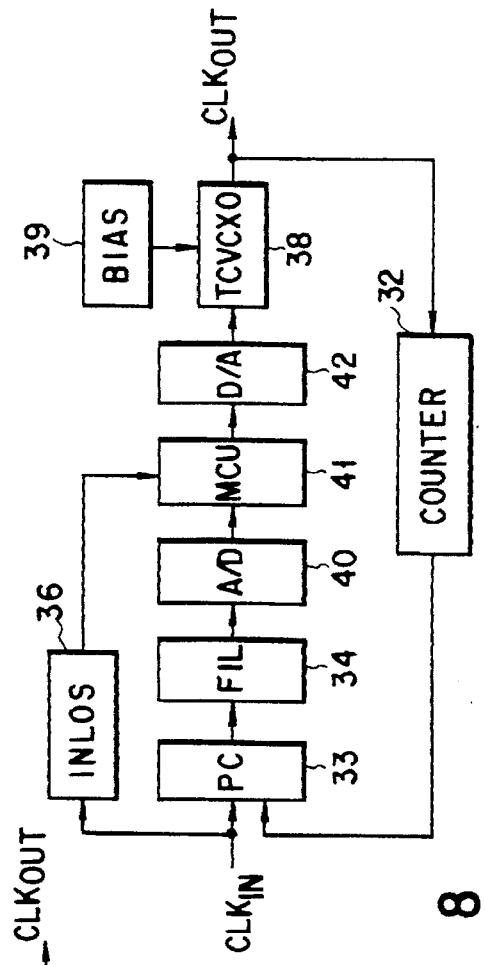
FIG. 8 is a block circuit diagram showing a configuration of a third embodiment of a PLL circuit having a holdover function in connection with the second invention.

FIG. 8 shows a third embodiment of a PLL circuit in connection with the second invention. In the PLL circuit in this embodiment, different points from the configuration of the second embodiment shown in FIG. 7 are that the delay circuit 37 and the holdover circuit 35 are omitted, and that an A/D converter (A/D) 40, a micro-control unit (MCU) 41 and a D/A converter (D/A) 42 are additionally provided between the low-pass filter 34 and the TCVCXO 38.

That is, an analog output of the low-pass filter 34 is converted by the A/D converter 40 to a digital value. The converted data is inputted into the micro-control unit 41, in which the data is held for a predetermined time and outputted therefrom. The micro-control unit 41 has a holdover function which when the input interruption detection signal from the input interruption detector 36 is received, outputs continuously the input waveform at that point. This processing satisfies the same function as the delay circuit used in the first or second embodiment.

The output of the micro-control unit 41 is converted by the D/A converter 42 to an analog value, and supplied to the bias corrected TCVCXO 38, and then the same operation as described in the first and second embodiments is executed.

Therefore, according to the configuration by the third embodiment, even if the reference clock signal CLKin is interrupted, the clock frequency at the holdover operation can be made the same as the frequency before the reference clock signal is interrupted, and at the same time, after the holdover, a clock frequency change can be suppressed with respect to the power voltage variation and the temperature variation.

Now, a digital PLL circuit can be also applied to the above-mentioned master-slave multiplex communication system. However, in a conventional digital PLL circuit, because often arithmetic processing delay of a digital filter, a change in control voltage may not be able to follow a change in phase comparison output, thereby making a synchronous pull-in difficult. That is, a sufficient capture range has not been obtained.

Thus, as a third invention, there are provided a digital PLL circuit which can obtain a sufficient capture range even if a digital filter has an arithmetic processing delay, thereby allowing a large phase change to be positively followed, and a digital filter thereof.

Figure 9:
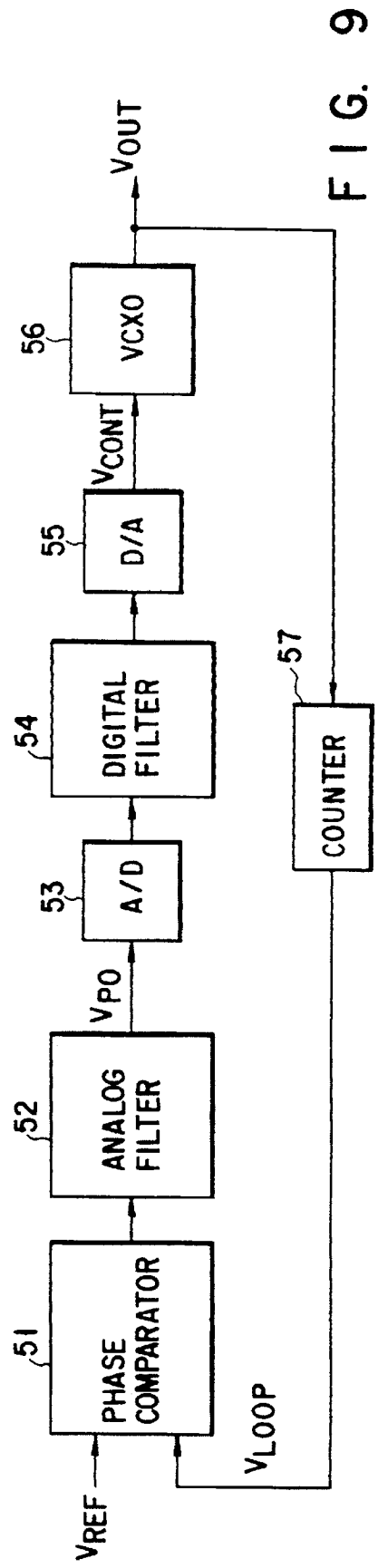
FIG. 9 is a block circuit diagram showing a configuration of one embodiment of a digital PLL circuit in connection with the third invention.

FIG. 9 is a block circuit diagram showing an entire configuration of a digital PLL circuit in connection with the third invention. That is, the digital PLL circuit has a voltage control crystal oscillator (VCXO) 56. An oscillation clock signal Vout of the VCXO 56 is frequency divided by a frequency divider 57 composed of a counter to become a feedback clock signal VLOOP, and then inputted together with a reference clock signal VREF supplied externally into a phase comparator 51.

In the phase comparator 51, a phase comparison between the above-mentioned feedback clock signal VLOOP and reference clock signal VREF is executed, and a pulse signal representing the phase difference as a duty is outputted. The pulse signal is integrated in an analog filter 52, and the integrated output signal Vpo is converted by an analog-to-digital converter (A/D) 53 to a digital signal and then inputted into a digital filter 54.

Figure 10:
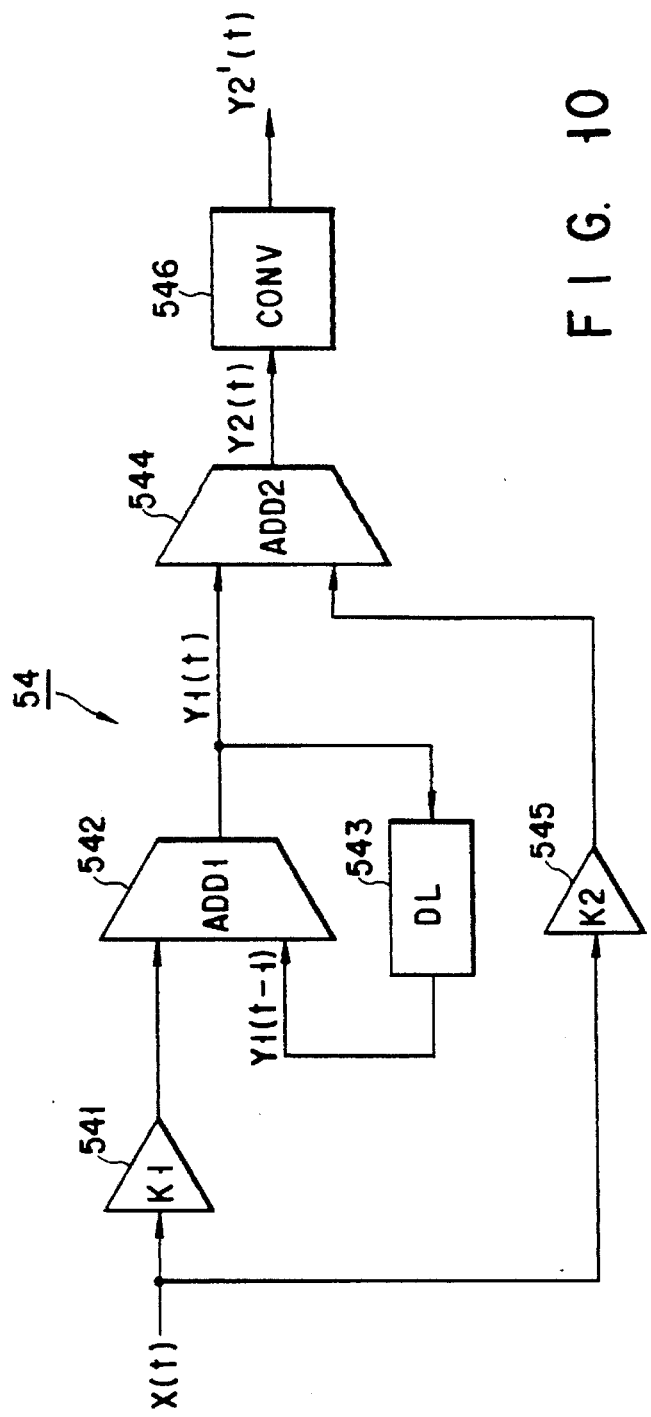
FIG. 10 is a block circuit diagram showing a configuration of a digital filter as a principal part in the digital PLL circuit in connection with the third invention.

The digital filter 54 is designed to execute an arithmetic processing in order to determine a loop band of the digital PLL circuit, which is implemented by, for example, an MCU (Multi Control Unit). One example of the function block configuration is shown in FIG. 10.

That is, an input signal X (t) is increased by K1 times in an amplification part 541, and inputted into an addition processing part (ADD1) 542, in which the input signal is added to an output signal Y1 (t−1) of the addition processing part 542 which is delayed in a delay processing part (DL) 543 and thus is a signal preceding by one sampling timing. That is, an output signal Y1 (t) is expressed in the following equation:

$$Y1(t) = K1 \times X(t) + Y1(t-1)$$

On the other hand, the input signal X (t) is increased by K2 times in an amplification part 545, and inputted into an addition processing part (ADD2) 544, in which the input signal is added to the output signal Y1 (t) of the addition processing part 542. That is, an output signal Y2 (t) is expressed in the following equation:

$Y2(t)=K2\times X(t)+Y1(t)$

By the above-mentioned processing, a filtering processing is implemented, and generally the output signal Y2 (t) of the addition processing part 544 is taken as an output of the digital filter 54. Then, a signal outputted from the digital filter 54 is converted in a digital-to-analog converter (D/A) 55 to an analog signal, and then supplied as a control voltage Vcont to the above-mentioned VCXO 56. This processing can produce, for example, an in-device clock Vout which is always in synchronism with the reference clock signal VREF supplied from a carrier side.

Now, in the digital PLL circuit by the above-mentioned configuration, as described previously, the digital filter 54 is used as a loop filter, and by the arithmetic processing in the digital filter 54, a filtering processing is executed. For this reason, for example, when the changeover of the reference clock signal VREF is made to cause the phase difference between the feedback clock signal VLOOP and the reference clock signal VREF to be largely changed, the phase difference could not be followed by the filtering processing of the digital filter 54, with the result that the phase pull-in may have not been executed in the PLL loop.

Thus, in the digital filter 54 shown in FIG. 10 of the digital PLL circuit of this embodiment, an output stage of the addition processing part (ADD2) 544 is provided with a signal level conversion processing part (CONV) 546.

Where the level of the output signal Y2 (t) of the addition processing part 544 becomes the maximum value and the minimum value determined by a limit of arithmetic processing bits in the addition processing part 544, the signal level conversion processing part 546 executes a conversion processing in which the level of the above-mentioned signal Y2 (t) is inverted to the minimum value and the maximum value, respectively. The level converted signal is outputted as a control signal Y2' (t) to the above-mentioned D/A converter 55.

In the above-mentioned configuration, the operation will be explained hereinafter.

First, where a micro-frequency variation or a micro-phase variation has occurred in the reference clock signal VREF, or where the changeover of the reference clock signal VREF has been made, when the phase change of the reference clock signal VREF is relatively small, and the phase difference between the feedback clock signal VLOOP and the reference clock signal VREF is also relatively small, in the digital filter 54, the level of the control signal Y2 (t) outputted from the addition processing part 544 does not reach the maximum value or the minimum value.

Thus, in the signal level conversion processing part 546, a level conversion operation is not executed, and the above-mentioned control signal Y2 (t) passes, in that state, through the signal level conversion processing part 546 and is supplied to the D/A converter 55, in which the signal is converted to a control voltage, and then supplied to the VCXO 56. That is, a normal phase synchronous operation is executed.

On the other hand, for example, when the changeover of the reference clock signal VREF is made, and the phase change is very large, the phase difference between the feedback clock signal VLOOP and the reference clock signal VREF becomes large. In response to it, an integrated output signal having a large level change is outputted from the analog filter 52, and after A/D converted, inputted into the digital filter 54.

At this point, the digital filter 54 requires a time for an arithmetic processing, so that the filter cannot follow the level change of the integrated output signal. Accordingly, the level of the control signal Y2 (t) reaches either of a maximum value Vmax and a minimum value GND.

Thus, in the digital filter 54 of this embodiment, the signal level conversion processing part 546 detects a fact that the level of the control signal Y2 (t) outputted from the addition processing part 544 reaches either the maximum value Vmax or the minimum value GND, and at that point, the signal is level converted to the minimum value GND or the maximum value Vmax.

FIGS. 11 and 12 show one example of respective conversion operations. That is, when a fact that the level of the control signal Y2 (t) becomes the maximum value Vmax is detected, as shown in FIG. 11, the level of the control signal Y2' (t) is set at the minimum value GND. Also, when a fact that the level of the control signal Y2 (t) becomes the minimum value GND is detected, as shown in FIG. 12, the level of the control signal Y2' (t) is set at the maximum value Vmax. By the above-mentioned processing, once the control voltage Vcont supplied to the VCXO 56 reaches the maximum value Vmax or the minimum value GND, the control voltage is forcedly level converted to the minimum value GND or the maximum value Vmax. Thus, the PLL loop follows the phase change, and as shown in FIG. 11 or 12, can pull in the phase synchronism.

As described above, in the digital PLL circuit of this embodiment, the output stage of the digital filter 54 is provided with the signal level conversion processing part 546, and when the level of the control signal Y2 (t) outputted from the addition processing part 544 reaches the maximum value Vmax or the minimum value GND by the signal level conversion processing part 546, the level of the above-mentioned control signal Y2 (t) is level converted to the minimum value GND or the maximum value Vmax, respectively, and the signal Y2' (t) after conversion is D/A converted, and then supplied as the control voltage Vcont to the VCXO 56.

Therefore, according to this embodiment, for example, even if at the changeover of the reference clock signal VREF, the phase change is vary large, and thus the large phase change cannot be followed by the control signal Y2 (t), consequently the control signal Y2' (t) similar to a case where the phase change is followed can be produced and supplied to the VCXO 56. Consequently, a sufficiently large capture range can be obtained, thereby allowing a large phase change to be positively followed.

Also, according to this embodiment, the signal level conversion processing can be executed collectively together with the digital filtering processing, so that there is an advantage that the signal level conversion processing can be implemented without causing a complexity in configuration and making large size. Although in the above-mentioned embodiment, there has been explained a case where a signal level conversion processing function is added to the digital filter 54 by way of example, the configuration may be made in hardware such that a signal level converter is provided between the digital filter 54 and the D/A converter 55 in FIG. 9. In this case, for example, where an existing digital filter 54 using LSI is provided, the digital filter is used in that state so that the present invention can be implemented.

Further, although in the above-mentioned embodiment, there has been explained a case where the signal level conversion processing part includes both a function of converting the control signal level to the maximum value Vmax and a function of converting the level to the minimum value GND, where the phase changing direction becomes always a certain direction, only one of the above-mentioned functions may be included corresponding to the phase changing direction.

Now, although there is no problem where the digital PLL circuit according to the above-mentioned embodiment provides a relatively low oscillation frequency of the VCXO and a relatively wide allowable range of the control voltage, where the VCXO having a high oscillation frequency and a narrow allowable range of the control voltage is used, it becomes further necessary to execute a highly accurate, synchronous pull-in processing.

Figure 13:
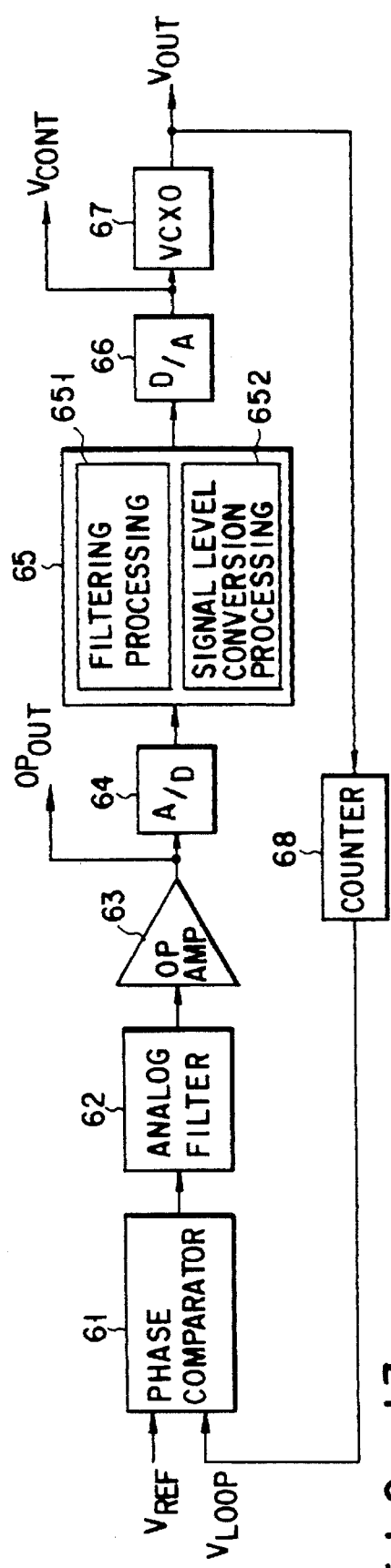
FIG. 13 is a block circuit diagram showing a configuration of one embodiment of a digital PLL circuit in connection with the fourth invention.

FIG. 13 is a block circuit diagram showing a configuration of one embodiment of a digital PLL circuit in connection with the fourth invention to satisfy the requirement. The digital PLL circuit has a voltage control crystal oscillator (VCXO) 67. An oscillation clock signal Vout of the VCXO 67 is frequency divided by a frequency divider 68 composed of a counter to become a feedback clock signal VLOOP, and then inputted together with a reference clock signal VREF supplied externally into a phase comparator 61.

In the phase comparator 61, a phase comparison between the above-mentioned feedback clock signal VLOOP and reference clock signal VREF is executed, and a pulse signal representing the phase difference as a duty is outputted. The pulse signal is integrated in an analog filter 62, and passes through an arithmetic amplifier (OPAMP) 63 to become an phase comparison signal OPout, and then is converted by an analog-to-digital converter (A/D) 64 to a digital signal and then inputted into a digital filter 65.

The digital filter 65 is configured by, for example, a microcomputer, and has a function 651 which executes a filtering arithmetic processing for determining a loop band of the digital PLL circuit by a program processing of the microcomputer. An output signal of the digital filter 65 is converted by a digital-to-analog converter (D/A) 66 to an analog signal, and then supplied as a control signal voltage Vcont to the above-mentioned VCXO 67. This causes the clock signal Vout produced in the VCXO 67 to be always synchronous with the reference clock signal VREF.

Now, for example, when the changeover of the reference clock signal VREF is made to cause the phase difference between the feedback clock signal VLOOP and the reference clock signal VREF to be largely changed, the phase difference cannot be followed by the filtering processing of the digital filter 54, with the result that the phase synchronous pull-in may not be executed in the PLL loop.

Then, when the waveform of the control signal voltage Vcont where the synchronous pull-in is not executed was investigated in detail, it was found that there have existed four kinds of the waveforms of the control signal voltage Vcont according to the changed frequency values of the reference clock signal VREF. These waveforms are shown in FIGS. 17, 19, 21 and 23.

First, FIG. 17 shows the waveform of the control signal voltage Vcont in which the low level becomes the minimum value of 0 V (GND) and the high level becomes the maximum value of 5 V. Assume that in this state, for example, the power for the digital PLL circuit is once turned off and then turned on. Then, the waveform of the control signal voltage Vcont is converged into a certain voltage as shown in FIG. 18, so that the digital PLL circuit becomes a synchronous state.

Then, FIG. 19 shows the waveform of the control signal voltage Vcont in which the low level is larger than the minimum value of 0 V and the high level becomes the maximum value of 5 V. Also, in this case, similarly to the case of FIG. 17, assuming that the power for the digital PLL circuit is once turned off and then turned on, then, as with the case of FIG. 18, the waveform of the control signal voltage Vcont is converged into a certain voltage as shown in FIG. 20, so that the digital PLL circuit becomes a synchronous state.

Also, FIG. 21 shows the waveform of the control signal voltage Vcont in which the low level becomes the minimum value of 0 V and the high level is smaller than the maximum value of 5 V. Also, in this case, similarly to the case of FIG. 17, assuming that the power for the digital PLL circuit is once turned off and then turned on, then, the waveform of the control signal voltage Vcont is converged into a certain voltage as shown in FIG. 22, so that the digital PLL circuit becomes a synchronous state.

Further, FIG. 23 shows the waveform of the control signal voltage Vcont in which the low level is larger than the minimum value of 0 V and the high level is smaller than the maximum value of 5 V. In this case, even if the power for the digital PLL circuit is once turned off and then turned on, the control signal voltage Vcont will not be converged. That is, it is understood that the power-on-reset is not valid.

Then, an attempt was made to change the frequency of the reference clock signal VREF within a certain width. The waveform at that point is shown in FIG. 25. As apparent from the figure, the control signal voltage Vcont is converged into a certain value, so that the digital PLL circuit becomes a synchronous state. That is, where the waveform of the control signal voltage Vcont is the one as shown in FIG. 23, it is sufficient to change the level of the control signal voltage Vcont. Specifically, in the digital filter, it is sufficient to convert the signal level after the filtering arithmetic processing to the maximum value or the minimum value.

Considering the above-mentioned facts, in order to solve a problem that the frequency of the reference clock signal VREF is largely changed to cause the synchronous pull-in not to be executed, it is sufficient to execute additionally the following processing for the signals after the filtering arithmetic processing:

(1) Where the signal level after the filtering arithmetic processing becomes the maximum value, a processing of converting the level of the signal to the minimum value and a processing of converting it to a central value are selectively executed.

(2) Where the signal level after the filtering arithmetic processing becomes the minimum value, a processing of converting the level of the signal to the maximum value and a processing of converting it to a central value are selectively executed.

(3) Where the signal after the filtering arithmetic processing becomes a pulse wave in which the high level is smaller than the maximum value and the low level is larger than the minimum value, the level of the signal is converted to at least one of the maximum value and the minimum value.

The digital PLL circuit in this embodiment, on the basis of the above-mentioned analysis results, has a configuration in which the digital filter 65 is provided with a signal level conversion processing function 652.

That is, the signal level conversion processing function 652 judges the signal level obtained in the above-mentioned filtering processing function 651, and when the signal level is the maximum value, executes alternately a processing of converting the signal level to the minimum value and a processing of converting it to a central value. On the other hand, when the signal level obtained in the above-mentioned filtering processing function 651 is the minimum value, the function executes alternately a processing of converting the signal level to the maximum value and a processing of converting it to a central value.

Further, the function judges whether or not the signal obtained in the above-mentioned filtering processing function 651 is a pulse wave in which the high level is smaller than the maximum value and the low level is larger than the minimum value. When the signal is such a pulse wave, the function executes at least one of a processing of converting the high level of the signal to the maximum value and a processing of converting the low level of the signal to the minimum value.

Figure 14:
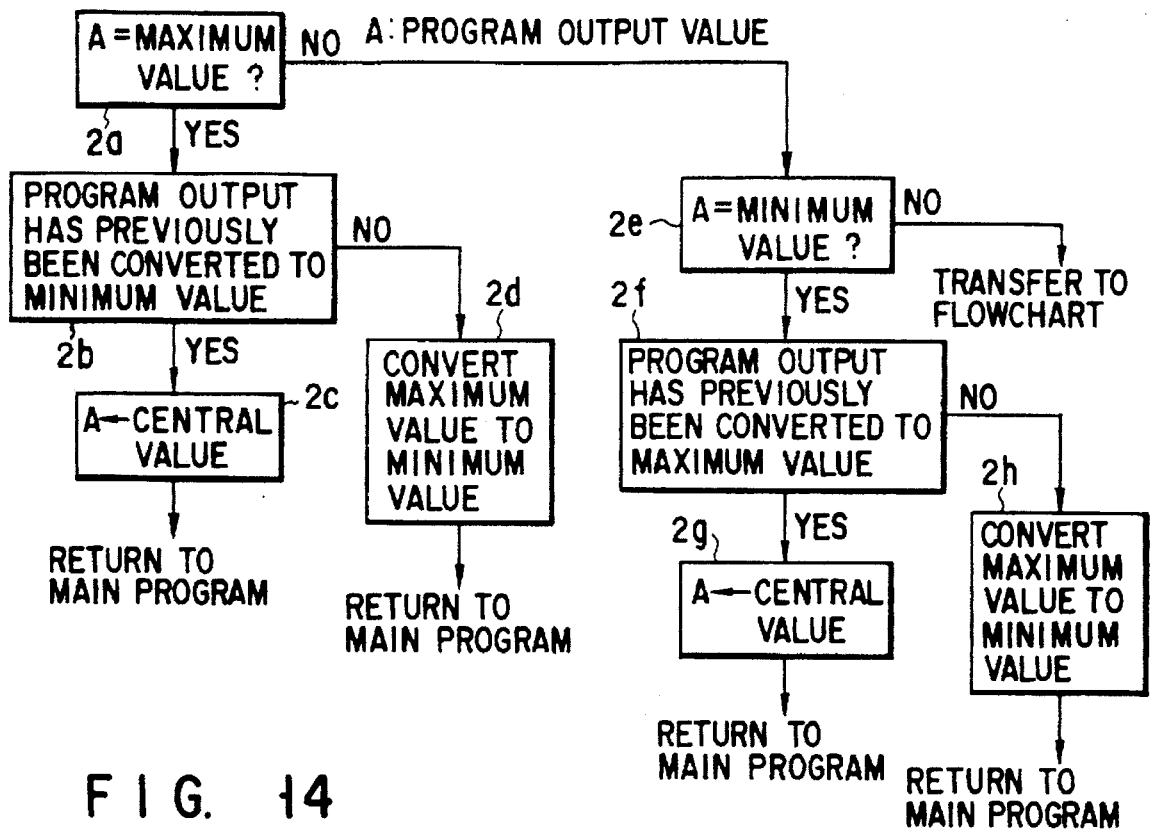
FIG. 14 is a flowchart showing a part of a signal level conversion processing in the digital filter of the digital PLL circuit shown in FIG. 13.
Figure 15:
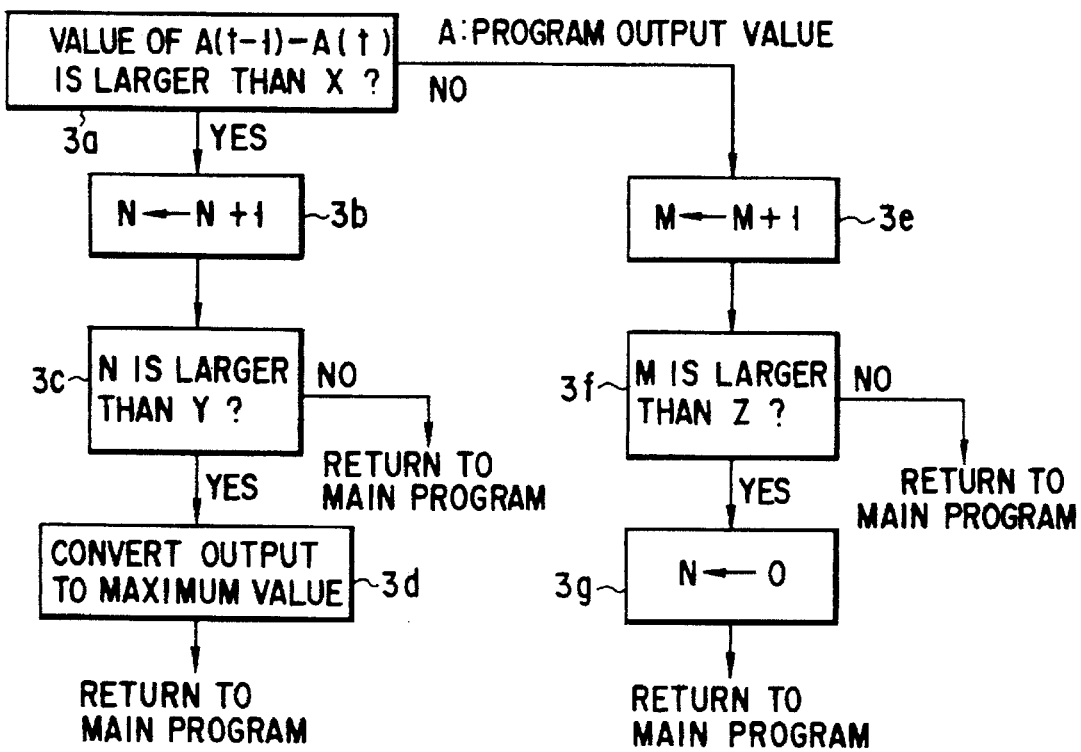
FIG. 15 is a flowchart showing another part of a signal level conversion processing in the digital filter of the digital PLL circuit shown in FIG. 13.

Then, the operation of the digital PLL circuit configured as described above will be explained according to the processing procedure of the digital filter 65. FIGS. 14 and 15 are flowcharts showing the processing procedure of the digital filter 65.

The digital filter 65 executes the filtering arithmetic processing for the signal supplied from the A/D converter 64, for each sampling timing thereof, first according to the main program of the filtering processing function 651.

Then, the digital filter 65 executes the processing described previously in (1) and (2), for each sampling timing of the signal after the above-mentioned filtering processing, according to the flowchart shown in FIG. 14. Now, assume that the maximum value is 5 V; the minimum value is 0 V; and the central value is 2.5 V.

First, in step 2a, a judgment is made on whether or not a signal level value (main program output value) A after the above-mentioned filtering processing is the maximum value (5 V). When as the result of the judgment, A is the maximum value (yes), at step 2b, a judgment is made on whether or not the value of the above-mentioned A has been converted to the minimum value in the preceded sampling timing.

When as the result of the judgment, A has not been converted (no), the value of the above-mentioned A is converted to the minimum value (0 V), and the process returns to the main program. On the contrary, when the value of the above-mentioned A has been converted to the minimum value in the preceded sampling timing (yes), then the process transfers to step 2c, at which the value of the above-mentioned A (the maximum value is 5 V) is converted to the central value (2.5 V), and then the process returns to the main program.

Also, at the above-mentioned step 2a, when the value of A is judged not to be the maximum value (5 V) (no), the process transfers to step 2e, at which a judgment is made on whether or not the value of the above-mentioned A is the minimum value (0 V). When as the result of the judgment, A is the minimum value, the process transfers to step 2f, at which a judgment is made on whether or not the value of the above-mentioned A has been converted to the maximum value in the preceded sampling timing.

When as the result of the judgment, A has not been converted (no), the process transfers to step 2h, at which the value of A is converted to the maximum value (5 V), and the process returns to the main program. On the contrary, when the value of the above-mentioned A has been converted to the maximum value in the preceded sampling timing (yes), then the process transfers to step 2g, at which the value of the above-mentioned A (the minimum value is 0 V) is converted to the central value (2.5 V), and then the process returns to the main program.

Thus, in cases where the signal level A after the filtering processing becomes, at the high level, the maximum value, and where the signal level A becomes, at the low level, the minimum value, a level conversion processing corresponding to the power-on-reset is executed. The signal thus level converted is converted as a control signal by the D/A converter 66 to the analog control voltage Vcont, and then supplied to the VCXO 67. Thus finally, the phase comparison signal OPout and the control signal voltage Vcont are converged into a certain value. This causes the digital PLL circuit to become a synchronous state for the reference clock signal VREF.

On the other hand, in the above-mentioned steps 2a and 2e, assume that the value of A is judged not to be the maximum value nor the minimum value. In this case, the digital filter 65 transfers to the processing according to the flowchart shown in FIG. 15, and executes the processing previously described in (3).

First, at step 3a, a judgment is made on whether or not the difference between the signal level A (t−1) obtained in the preceded sampling timing as shown in FIG. 16 and the signal level A (t) obtained in the current sampling timing is larger than a predetermined value X.

When as the result of the judgment, A (t−1) A−(t)≧X (yes), the process transfers to step 3b, at which a discrimination constant N is incremented, and then the process transfers to step 3c, at which whether or not the N is larger than a specified value Y is judged.

When as the result of the judgment, N≧Y (yes), a pulse wave in which the high level of the control signal voltage Vcont is smaller than the maximum value, and the low level is larger than the minimum value is judged to be continuous, and at step 3d, the signal level after the above-mentioned filtering processing is converted to the maximum value (5 V), and then the process returns to the main program. On the contrary, when at the above-mentioned step 3c, N<Y is judged (no), in that state, the process returns to the main program.

On the other hand, when at the above-mentioned step 3a, A (t−1)−A (t)<X (no), the process transfers to step 3e, at which a discrimination constant M is incremented, and then the process transfers to step 3f, at which whether or not the M is larger than a specified value Z is judged. When as the result of the judgment, M<Z (yes), the control signal voltage Vcont is judged to be converged into a certain voltage, and the digital PLL circuit to be synchronous, and at step 3g, the above-mentioned discrimination constant N is cleared, and then the process returns to the main program. On the contrary, when at the above-mentioned step 3f, M is judged to be smaller than Z (no), the digital PLL circuit is not judged to be synchronous, so that in that state, the process returns to the main program.

Thus, where the signal level after the filtering arithmetic processing becomes a pulse wave in which the high level and low level are not the maximum value and minimum value, respectively, the signal level after the above-mentioned filtering processing is converted to the maximum value. The signal thus level converted is converted by the D/A converter 66 to the analog control signal voltage Vcont, and supplied to the VCXO 67. Thus finally, the phase comparison signal OPout and the control signal voltage Vcont are converged into a certain value. This causes the digital PLL circuit to become a synchronous state for the reference clock signal VREF.

In the digital PL1 circuit having the signal level conversion processing function as described above, a circuit operation when the frequency of the reference clock signal VREF is made changed was investigated by measurement. The results are shown in FIGS. 26, 27 and 28.

These results were obtained by changing respective frequencies of the reference clock signal VREF from 2.48110 MHz to 2.048070 MHz, 2.048050 MHz and 2.047920 MHz, respectively, and measuring the waveform of the control signal voltage Vcont and the phase comparison signal OPout at that point.

From the above-mentioned FIGS. 26, 27 and 28, it is understood that the control signal voltage Vcont is converged into a certain voltage for all the frequency changes of the reference clock signal VREF, so that the digital PL1 circuit becomes synchronous.

The waveform of the reference clock signal VREF and the feedback clock signal VLOOP when the operation shown in the above-mentioned FIGS. 26, 27 and 28 has been executed is shown in FIGS. 29, 30 and 31, respectively.

As apparent from these figures, not to mention a case where the frequency change of the reference clock signal VREF is relatively small (FIG. 29) or where the change becomes large to some extent (FIG. 30), and even where the frequency change of the reference clock signal VREF becomes further large (FIG. 31), the digital PLL circuit becomes synchronous in a state in which the fall timing of the reference clock signal VREF is coincident with the rise timing of the feedback clock signal VLOOP. That is, for any frequency change, a plurality of phase synchronous points are not generated, and a phase synchronism is established always at one phase synchronous point.

Therefore, for this embodiment, the frequency change of the reference clock signal VREF cannot be followed by the filtering arithmetic processing of the digital filter 65, and when the signal level after the filtering arithmetic processing becomes the maximum value or the minimum value, the signal level after the above-mentioned filtering arithmetic processing is converted to the minimum value or the central value, or the maximum value or the central value, respectively. Also, where the signal level after the filtering processing becomes a pulse wave in which the level does not become the maximum value or the minimum value, the signal level after the above-mentioned filtering processing is changed to the maximum value or the minimum value.

As a result, because of the arithmetic processing delay of the digital filter 65, the signal level which did not rise to the maximum value, and the signal level which did not fall to the minimum value are set at a level at which a forced synchronous pull-in is possible. Thus, even if the frequency change of the reference clock signal VREF cannot be followed by the control signal after the filtering processing because of the arithmetic processing delay of the digital filter 65, consequently, the control signal voltage Vcont as with a case where the frequency change is followed will be produced, thereby allowing the voltage to be supplied to the VCXO 67. Accordingly, as a result, a sufficiently large capture range can be obtained, whereby allowing the digital PLL circuit capable of following positively a large frequency change to be provided.

Also, as described above, the signal level conversion processing is executed, whereby the phase comparison signal OPout is converged into a certain value (for example, 0 V). Thus, the digital PLL circuit becomes synchronous in a state in which the fall timing of the reference clock signal VREF and the rise timing of the feedback clock signal VLOOP area coincident with each other, so that the phase synchronous point becomes not plurality but one point. Therefore, a stable output clock signal Vout without a phase shift can be generated. This allows a miss operation not to be generated in a circuit such as a gate array which operates upon receiving the output clock signal Vout.

Although in the above-mentioned embodiment, a case where the signal level conversion processing is executed by the microcomputer of the digital filter 65 has been explained by way of example, the digital PLL circuit may be configured in such a manner that a circuit having a signal level conversion function is provided between the digital filter 65 and the D/A converter 66, and in the circuit the signal level conversion processing is executed.

Generally, a plurality of sources of reference clock signals are connected to a PLL circuit so that the PLL circuit may operate with high reliability. Thus, an important design item is the transient response of the loop to any reference clock signal which has just replaced a reference clock signal from another source. In the case where many PLL circuits are connected in cascade, the slower the transient response, the better. If the response of the loop filter is reduced to render the transient response slower, however, the loop filter responds to an input slowly while operating normally. The range of the control voltage for the VCXO 31 may be narrowed, but the limited range of the control voltage will change if the appearing characteristic of the VCXO 31 varies.

Figure 32:
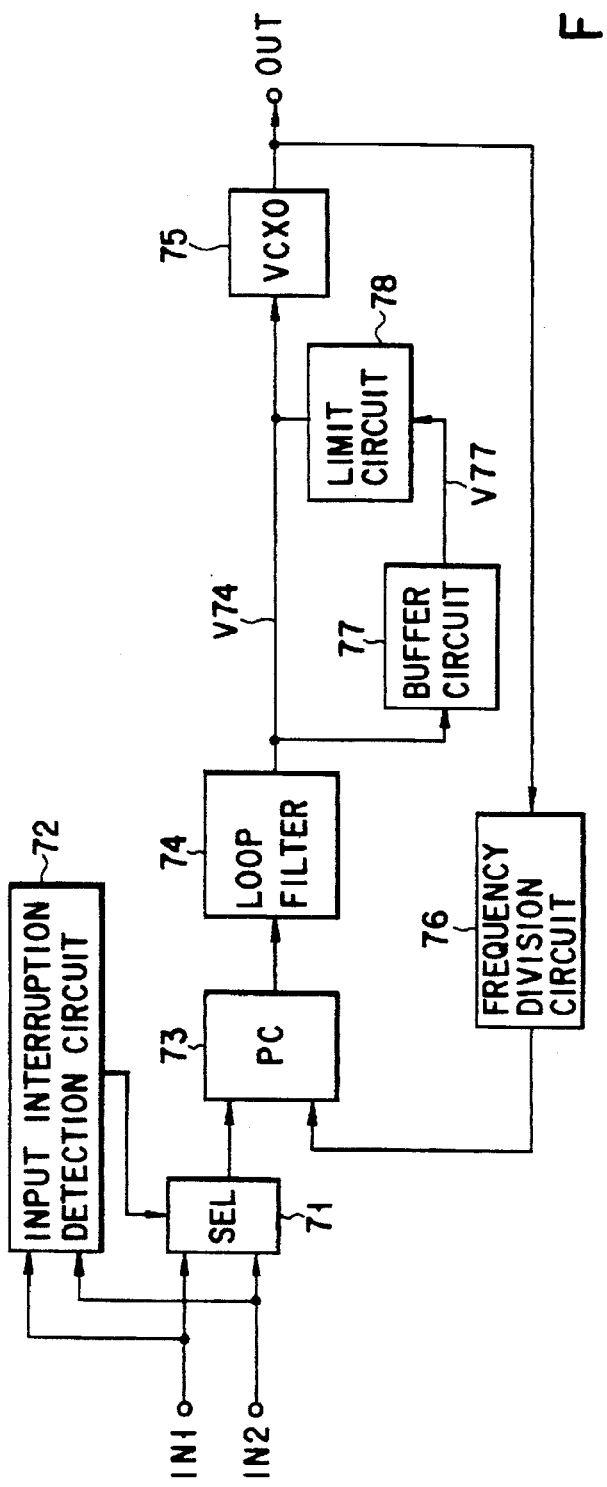
FIG. 32 is a block circuit diagram showing a first embodiment of a PLL circuit in connection with a fifth invention.

FIG. 32 shows the configuration of a first embodiment of a PLL circuit in connection with a fifth invention which solves the problem. Reference clock signals IN1, IN2 of two systems are inputted externally. The two inputs IN1, IN2 are selected in a selector (SEL) 71. The selection changeover control of the selector 71 is executed by an input interruption detection circuit 72. That is, the control is executed in such a manner that when the two input signals are normal, one of the signals is selected, and when the one signal is interrupted, the one signal is changed over to the other input signal to execute the operation.

The reference clock signal selected by the selector 71 is supplied to one input terminal of a phase comparator (PC) 73, and the output of a VCXO 75 supplied to the other input terminal is frequency divided by a frequency division circuit 76, whereby the reference clock signal is phase compared with the signal thus frequency divided.

The phase error signal obtained by the phase comparison is inputted into a loop filter 74. The loop filter 74 is designed to convert the output of the phase comparator 73 to the control voltage of the VCXO 75 by the use of a designed transfer function. Generally, a lag lead filter, a complete integration-type filter, or the like is used for the loop filter.

As an output OUT of the PLL circuit having the above-mentioned configuration, a high-rate clock in synchronism with the frequency of the IN1 or IN2 of the reference clock signal is obtained. In a communication device, the PLL circuit output is distributed in the device to use. Also generally, in order to produce a higher-rate clock in the device, a plurality of PLL circuits are connected to each other in a multiple-stage fashion.

A problem with the case is the response characteristics when PLL circuits are connected in a multiple-stage fashion. Particularly, when in the PLL circuit at the previous stage, a problem with the reference clock signal occurs to cause the changeover to the other reference clock signal, whether the PLL circuit at the following stage can be followed becomes a problem. If the PLL circuit at the following stage cannot be follow a change in the PLL at the previous stage, an operating clock will not synchronize with the reference clock in the device, so that a normal data transfer will not be executed.

In order that such a problem does not occur, where PLL circuits are connected in a multiple-stage fashion, the PLL circuits are designed so that the response characteristics of the PLL circuit at the previous stage is made higher in rate than that of the PLL circuit at the following stage, and made wider in the frequency range capable of synchronizing than the latter.

As described above, the circuit design is subject to design restrictions in order to continuously connect the circuits, and further, it becomes necessary to investigate a component device having a required characteristics or to develop a new circuit, so that an assembled product may often become considerably expensive. Also, by the restrictions of parts and the like to be used, the conditions are not always satisfied.

Now, in the PLL circuit shown in FIG. 32, when the input reference clock signal is interrupted, the input of the phase comparator 73 also goes out before a trouble is detected in the input interruption detection circuit 72, and then when a new reference clock signal is selected, the PLL becomes again synchronous with the phase of the new reference clock signal. Also, there is no guarantee that the new reference clock signal has the same phase as that of an original reference clock signal.

The transient response characteristics at that point depends on the transfer characteristics of the PLL. That is, the control voltage of the VCXO 75 is excited according to the step response of the loop filter 74. For this reason, the time constant of the loop filter 74 is made large to allow the response characteristics at the changeover to be delayed, while the response at the steady state must be delayed.

Thus, the PLL circuit is designed to include a buffer circuit 77 and a limit circuit 78.

The buffer circuit 77 is a circuit in which taking an output voltage 74 of the loop filter 74 as a reference, a voltage equal in direct current to the reference can be taken out as an output V77. That is, the buffer circuit 77 has one time the gain, provided that the accuracy is out of consideration, so that the magnification may not be 1 (one) strictly. Also, the time response characteristics of the buffer circuit 77 is set in such a manner that the response characteristics is made delayed behind the time response characteristics of the control voltage V74 determined by the response characteristics of the loop filter 74 and the like.

The output voltage V77 of the buffer circuit 77 thus designed is equal in direct current to the control voltage V74. That is, the output voltage follows at an equal value to a very slow change such as a temperature variation and a time-dependent change in power voltage. However, the voltage does not follow a change of the control voltage V74 at the changeover of the inputs IN1, IN2 when the input of the phase comparator 73 is changed stepwise, and holds the voltage applied before the changeover to some extent. Therefore, a voltage difference occurs between the control voltage V74 and the output voltage V77 of the buffer circuit 77. The limit circuit 78 is additionally provided so that when the voltage difference exceeds a certain range, the control voltage V74 is not further changed taking the buffer output voltage V77 as a reference.

However, in order to obtain the limit characteristics taking the output V77 of the buffer circuit 77 as a reference to the last, it is sufficient to make a load impedance on the output side of the buffer circuit 77 lower than the side of the control voltage V74.

Figure 33:
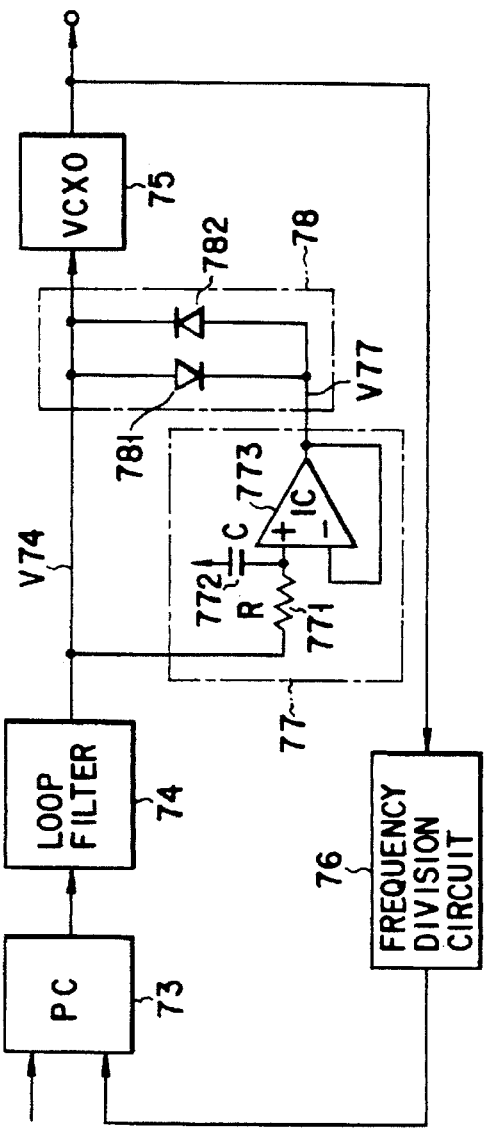
FIG. 33 is a block circuit diagram showing a specific configuration of the embodiment.

An example of a case where this is implemented by an actual circuit is shown in FIG. 33. The buffer circuit 77 is configured and implemented, for example, in such a manner that the control voltage V74 is filtered by a resistance (R) 771 and a capacitor (C) 772, and then amplified in a voltage follower circuit by an operational amplifier (IC) 773 and outputted. The gain depends on the voltage follower circuit, and becomes substantially 1 (one). The time response characteristics becomes the characteristics of a low-pass filter which are determined by the values of the resistance R and the capacitor C.

The limit circuit 78 can be implemented by connecting diodes 781, 782 between the transmission line of the control voltage V74 and the transmission line of the output V77 of the buffer circuit 77 in such a manner that the diodes become opposite direction to each other. In this configuration, with respect to the output V77 of the buffer circuit 77, the control voltage V74 changes in the positive and negative directions only by a drop voltage in the forward direction of the diodes 781, 782, respectively, and is limited where the difference is larger than the drop voltage. The limit value, that is, the drop voltage in the forward direction is generally 0.3 to 0.8 V in a silicon diode.

Figure 34A:
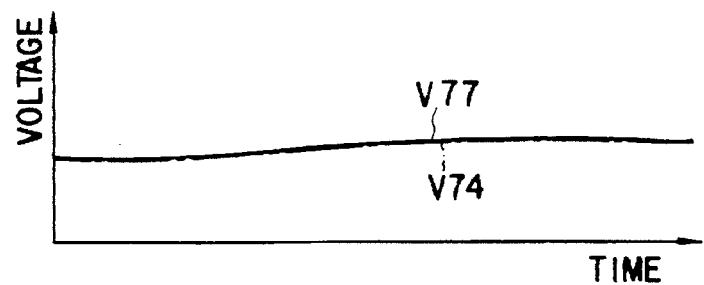
FIGS. 34A and 34B are characteristic charts showing the time response characteristics of a VCO control voltage to help explain the operation of the embodiment.
Figure 34B:
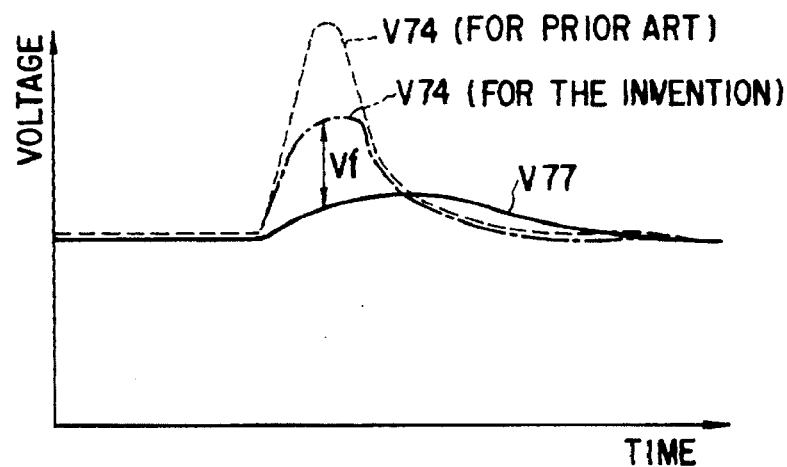

FIGS. 34A and 34B are waveform charts showing the response operation in the above-mentioned configuration, in which FIG. 34A shows a case where the control voltage V74 slowly fluctuates with time, and FIG. 34B shows a case where the control voltage V74 rapidly changes by the changeover of the reference clock signal. The waveform shown by the dotted line in FIG. 34B is a change in the control voltage of a conventional PLL circuit, and shown for simplicity of explanation.

As seen from FIGS. 34A and 34B, where the control voltage V74 slowly fluctuates, the output voltage V77 of the buffer circuit 77 follows the control voltage V74, so that a voltage difference between both hardly occurs. However, where the control voltage V74 rapidly changes, a large voltage difference occurs, and consequently, the control voltage V74 fluctuates at a value limited by a drop voltage Vf by the diode 781 as shown by the one-dot line in FIG. 34B.

That is, even where the control voltage V74 rapidly changes as shown in FIG. 34B, the buffer circuit 77 does not respond, and a difference of the drop voltage Vf or more by the diode 781 tends to occur between the control voltage V74 and the buffer output V77, so that the diode 781 becomes a low impedance. Accordingly, a change of the control voltage V74 can be limited. When this is considered to be a phase change in the output OUT of the PLL circuit, the structure of the present invention cause a rapid phase change not to occur.

Figure 35A:
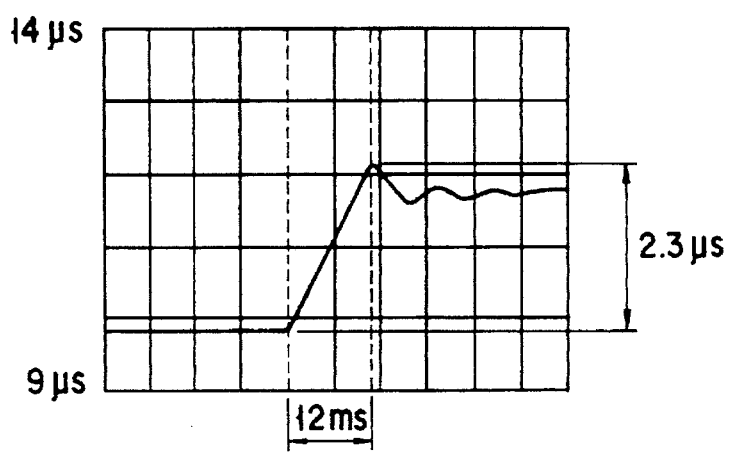
FIGS. 35A and 35B are waveform charts showing the results obtained by confirming the effect of the embodiment.
Figure 35B:
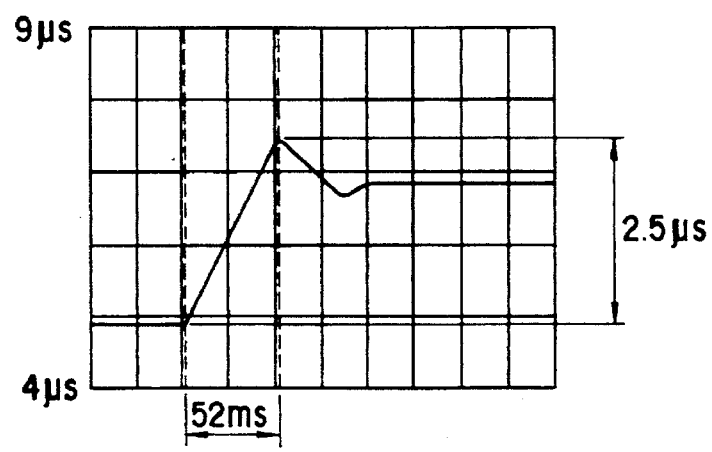

Now, an example of a test to which the present invention was actually applied is shown in FIGS. 35A and 35B. FIGS. 35A and 35B show results obtained by frequency dividing the phase change in the output OUT of the PLL circuit into the same frequency as that of an input clock, and measuring the phase change between both by a time interval analyzer. What is changed is the phase change when the inputs IN1, IN2 of the PLL circuit is changed over, and FIGS. 35A and 35B show the phase change before the present invention is performed, and that after the present invention is performed, respectively. Now, the axis of ordinate indicates the phase difference of the input/output of the PLL, expressing the phase difference in the change and time (fs unit). The axis of abscissa is the time axis, indicating one division as 5 ms in FIG. 35A, and as 25 ms in FIG. 35B.

In each case, before and after the input is changed over, the phase is changed by about two microseconds, which is an initial phase difference of the input. However, determining a time taking to change, that is, a time between the dotted lines a and b shown in figures, the time is about 12 ms in FIG. 35A, and 52 ms in FIG. 35B.

As seen from the results, the present invention postpones successfully the time required for the phase change at he changeover to about four times that before the present invention is performed. Converting this to a variation in an instantaneous frequency, the variation becomes about 166 ppm for 35A, and about 40 ppm for 35B. The frequency fluctuates instantaneously to the maximum value of the variable range of a voltage control oscillator for 35A, while the application of the present invention causes the variation to be successfully suppressed.

By this effect, when the PLL is continuously connected, heretofore, it has been necessary to consider the input of the following PLL plus ± about 200 ppm as the maximum value of variation. On the contrary, when the present invention is applied, it is sufficient to consider ±40 ppm as the maximum value of variation for the design. This is equivalent to a fact that the restriction of a device to be used or the restriction in design is eased four times the conventional one.

Also, measuring the lock-in range indicates that it is the same as the conventional one. That is, it was also confirmed that the characteristics of following a slow change of an input is the same as prior art examples.

Although as described above, for simplicity of explanation, only one specific example has been taken, it is obvious that the same effect can be implemented by variously modified configurations. For example, what is used as a limit circuit is not limited to a diode, and may be a Zanier diode, or may employ a plurality of diodes to change the limit voltage. In this manner, the limit circuit can be implemented by various configurations.

Also for the buffer circuit 77, though the configuration composed of the operational amplifier, the resistance and the capacitor has been shown in the above-mentioned specific example, only that configuration is not limited as a circuit implementing the same function. Particularly, where the function is implemented by an integrated circuit, a function of delaying the response characteristics may be incorporated into the voltage follower circuit itself.

As explained above, when the above-mentioned technique is applied, the phase variation characteristics at the changeover of the input of the PLL circuit can be adjusted by a simple method, so that the degree of freedom of design when the PLL circuits are connected in a multiple-stage fashion can be increased and thus the range of component device selection becomes wider. In this manner, when design time is shortened and the range of component device selection becomes wider, it becomes possible to implement and provide the component device at a lower cost.

Figure 36:
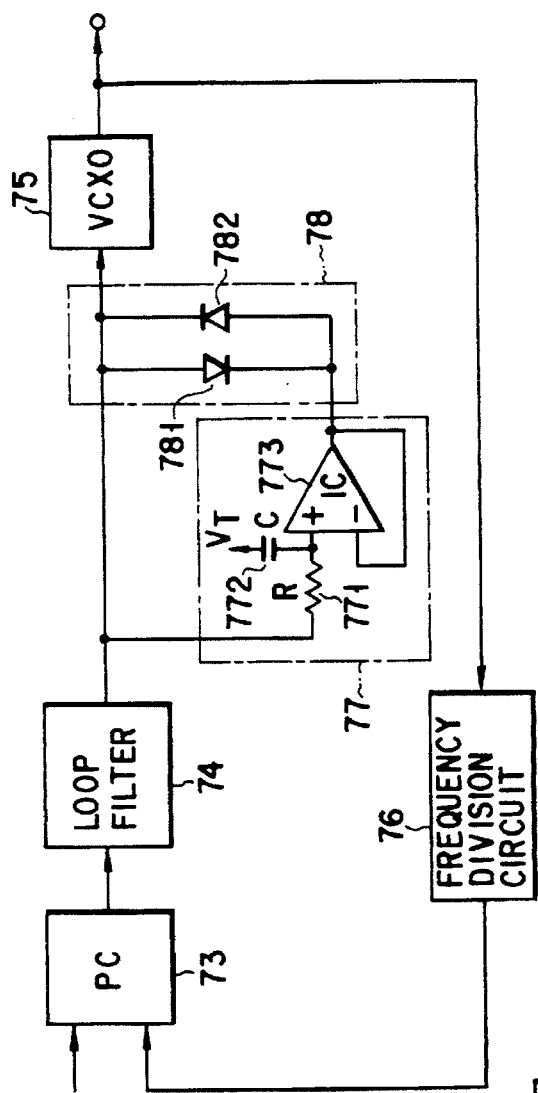
FIG. 36 is a block circuit diagram showing the configuration of a second embodiment in connection with a fifth invention.

Then, with reference to FIG. 36, the configuration of a second embodiment of a PLL circuit in connection with the fifth invention will be explained. In FIG. 36, the same parts as in FIG. 33 are designated by the same reference codes to indicate, so that only different parts will be explained here.

That is, although in the example of the first embodiment shown in FIG. 33, the capacitor 772 of the buffer circuit 77 is grounded, in the second embodiment, the capacitor is connected to a direct-current voltage VT. The direct-current voltage VT is set in a manner to be substantially equal to the voltage of the control voltage V74 in a steady state. The configuration allows, for example, the operation at the moment when power is turned on to be made stabilized at a higher rate.

Figure 37:
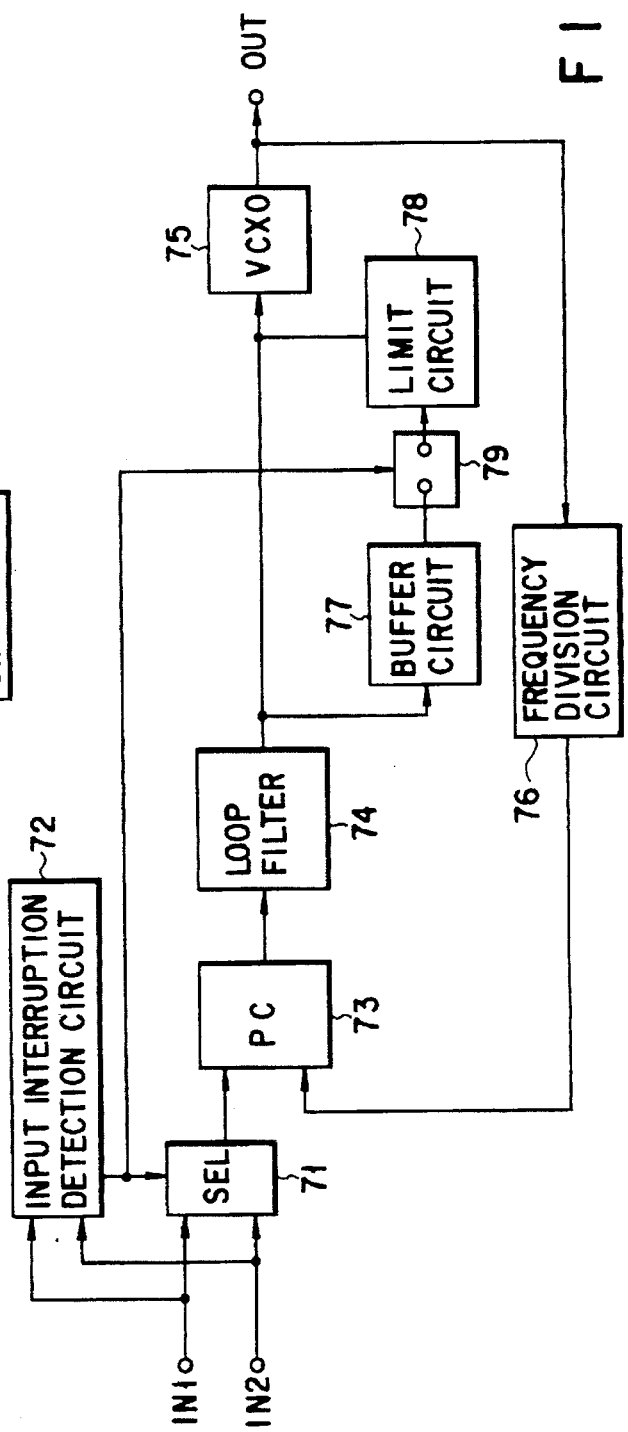
FIG. 37 is a block circuit diagram showing the configuration of a third embodiment in connection with a fifth invention.

Further, with reference to FIG. 37, the configuration of a third embodiment of a PLL circuit in connection with the fifth invention will be explained. In FIG. 37, the same parts as in FIG. 32 are designated by the same reference codes to indicate, so that only different parts will be explained here.

That is, when the limit operation is required in the PLL circuit is a case where the input interruption of the reference clock signal causes the changeover of the reference clock signal to occur, so that in a steady operation state, it is not required. Thus, in this embodiment, a switch 79 is provided between the buffer circuit 77 and the limit circuit 78, and the switch 79 is on/off controlled by the input interruption detection signal of the input interruption detection circuit 72.

According to the configuration, in a steady operation state, the limit circuit 78 is not operated, and operated only when the input interruption occurs, so that an unstable state in a steady operation can be avoided.

According to the PLL circuit having a redundant configuration by the above-mentioned configuration, a simple configuration allows the transient response characteristics of the output phase variation occurring at the changeover of the reference clock signal to be delayed, and a variation in a steady state and a micro-variation to be responded at a high rate.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A master-slave multiplex communication system comprising:
    a first communication device and a second communication device, each comprising,
        respective selection circuits for selecting any one clock signal of a reference clock signal and a slave synchronization clock signal, and
        clock production circuits for producing a synchronous clock signal for data signal processing from the clock signal selected in the respective selection circuits, said respective selection circuits being supplied with another clock signal selected by a mating-side selection circuit, which is the other selection circuit of said respective selection circuits, as the slave synchronization clock signal, whereby any one of said first and second communication device selects said reference clock signal to become a master, and the other communication device selects said slave synchronization clock signal to become a slave; and
    a multiplexing device for inputting via respective transmission lines respective data signals obtained in the first and the second communication devices and respective synchronous clock signals, and bit multiplexing the respective data signals to transmit and output a multiplexed data signal,
    wherein a processing time of the respective selection circuit and the clock production circuit of respective of said first and second communication devices is made equivalent to a delay time occurring in a transmission line of the slave synchronization clock signal to a mating-side communication device which is the other of said first and second communication devices.

2. The master-slave multiplex communication system according to claim 1, wherein said first and second communication devices comprise respective delay circuits for delaying the slave synchronization clock signal, respective outputs of said delay circuits connected to the selection circuits, respectively; and a delay imparted by said delay circuits is made equivalent to a phase difference between a first clock signal transmitted in a first path from said selection circuits through the clock production circuits to the multiplexing device and a second clock signal transmitted in a second path from said selection circuits through the selection circuits of the mating-side communication device and the clock production circuits to the multiplexing device.

3. A PLL circuit comprising:
    clock generation means for generating a clock signal which becomes an output signal and making variable a frequency thereof according to a voltage level of a control signal;

delay means for receiving a reference clock signal and postponing it a certain time;

phase comparison means for phase comparing the clock signal generated in said clock generation means with the reference clock signal outputted from said delay means, and producing a phase difference signal thereof;

control signal production means for producing a control signal to said clock generation means on the basis of the phase difference signal obtained in said phase comparison means;

input interruption detection means for detecting an input interruption of said reference clock signal; and holdover processing means for outputting the control signal produced by said control signal production means to said clock generation means when the input interruption is being detected by said input interruption detection means, and holding the voltage level of the control signal and outputting the control signal to said clock signal generation means at a point when the input interruption has been detected by said input interruption detecting means.

4. The PLL circuit according to claim 3, wherein said holdover processing means performs a digital processing to delay the control signal outputted by said control signal production means for a predetermined time and hold the control signal when said input interruption detection means detects the input interruption.

5. The PLL circuit according to claim 3, wherein said clock generation means comprises means for compensating for temperature and for stabilizing a bias when generating said clock signal.

6. A digital PLL circuit comprising:

clock generation means for generating a clock signal and making variable a frequency thereof according to a control signal;

phase comparison means for phase comparing the clock signal generated in the clock generation means with a reference clock signal, and producing a phase difference signal thereof;

an analog filter for integrating the output signal of the phase comparison means thereby to generate a control signal for said clock generation means;

an analog-to-digital converter for converting an output signal of the analog filter to a digital control signal;

a digital filter which is provided with level conversion processing means which converts the level of said digital control signal to the minimum value within the allowable range when the level of the digital signal produced by the filtering processing means becomes the maximum value within an allowable range and which converts the level of said digital signal to the maximum value within the allowable range when the level of said digital signal becomes the minimum value within the allowable range; and a digital-to-analog converter for converting a digital signal outputted from the digital filter to an analog signal, and supplying the analog signal to said clock generation means.

7. The digital PLL circuit, according to claim 6, wherein said digital filter includes:

filtering processing means for receiving a digital signal outputted from said analog-to-digital converter and for performing filtering processing to set a loop frequency band of the digital PLL circuit and thereby to produce a digital control signal to frequency-control said clock signal to be synchronized; and level conversion processing means which where the level of the digital signal produced by the filtering processing means becomes the maximum value within an allowable range, converts the level of said digital signal to the minimum value within the allowable range, and which where the level of said digital signal becomes the minimum value within the allowable range, convert the level of said digital signal to the maximum value within the allowable range.

8. A digital PLL circuit comprising:

clock generation means for generating a clock signal and making variable a frequency thereof according to a control signal;

phase comparison means for phase comparing the clock signal generated in the clock generation means with a reference clock signal, and producing a phase difference signal thereof;

an analog filter for integrating the output signal of the phase comparison means thereby to generate a control signal for said clock generation means;

an analog-to-digital converter for converting an output signal of the analog filter to a digital control signal;

a digital filter which is provided with level conversion processing means which converts selectively the level of said digital control signal to the minimum value or the central value within the allowable range when the level of the digital signal produced by the filtering processing means becomes the maximum value within an allowable range, which converts selectively the level of said digital signal to the maximum value or the central value within the allowable range when the level of said digital signal becomes the minimum value within the allowable range, and which converts the level of said digital signal to at least one of said maximum value and minimum value when the level of said digital signal becomes the level of a pulse wave which is smaller than the maximum value and larger than the minimum value within the allowable range; and a digital-to-analog converter for converting a digital signal outputted from the digital filter to an analog signal, and supplying the analog signal to said clock generation means.

9. The digital PLL circuit according to claim 8, wherein said digital filter includes:

filtering processing means for receiving the digital control signal outputted from said analog-to-digital converter and for performing a filtering processing to set a loop frequency band of the digital PLL circuit thereby to produce a digital control signal to execute a frequency control of said clock signal to be synchronized; and level conversion processing means which where the level of the digital signal produced by the filtering processing means becomes the maximum value within an allowable range, convert selectively the level of said digital signal to the minimum value or the central value within the allowable range, which where the level of said digital signal becomes the minimum value within the allowable range, convert selectively the level of said digital signal to the maximum value or the central value within the allowable range, and which where the level of said digital signal becomes the level of a pulse wave which is smaller than the maximum value and larger than the minimum value within the allowable range, convert the level of said digital signal to at least one of said maximum value and minimum value.

10. A PLL circuit comprising:

clock generation means for generating a clock signal and making variable a frequency thereof according to a control signal;

phase comparison means for phase comparing the clock signal generated in the clock generation means with a reference clock signal, and producing a phase difference signal thereof;

a loop filter for integrating the phase difference signal obtained by the phase comparison means, and producing a voltage control signal to said clock generation means;

a buffer circuit which taking the output voltage of said loop filter as a reference, produces a voltage equal in direct-current to the output voltage by response characteristics delayed behind the response characteristics of said loop filter, said buffer circuit comprising, a low-pass filter for extracting a low band component of the output voltage of said loop filter, and a voltage follower circuit for amplifying and outputting the output voltage of the low-pass filter, so that time response characteristics are determined by said low-pass filter and a gain is determined by said voltage follower circuit; and a limit circuit which is interposed between an output terminal of the buffer circuit and an output terminal of said loop filter, and which when a voltage difference between both the output terminals becomes a specified voltage or more, limits the output voltage of said loop filter to the specified value.

11. The PLL circuit according to claim 10, wherein the output terminal of said low-pass filter is terminated at an electric potential with a value near the control voltage of said clock generation means at a steady-state operation.

12. The PLL circuit according to claim 10, wherein said PLL circuit further includes a selector which selects one of a plurality of reference clock signals when there are plurality of said input reference clock signals, and an input interruption detection circuit which monitors an input state of said plurality of reference clock signals, and sends an input interruption detection signal to said selector to changeover control said selector manner to select another reference clock signal when there occurs an input interruption of a reference clock signal selected by said selector.

13. The PLL circuit according to claim 10, wherein a switch is interposed between the output terminal of said buffer circuit and the output terminal of said limit circuit so as to on/off control the switch according to said input interruption detection signal.

* * * * *